(12) United States Patent
Uchida et al.

(10) Patent No.: US 12,068,014 B2
(45) Date of Patent: Aug. 20, 2024

(54) SEMICONDUCTOR APPARATUS AND METHOD FOR MANUFACTURING THE SAME

(71) Applicant: Sony Semiconductor Solutions Corporation, Kanagawa (JP)

(72) Inventors: Hiroyuki Uchida, Kanagawa (JP); Yasuo Kanda, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 115 days.

(21) Appl. No.: 17/800,656

(22) PCT Filed: Feb. 11, 2021

(86) PCT No.: PCT/JP2021/005127
§ 371 (c)(1),
(2) Date: Aug. 18, 2022

(87) PCT Pub. No.: WO2021/186968
PCT Pub. Date: Sep. 23, 2021

(65) Prior Publication Data
US 2023/0352070 A1    Nov. 2, 2023

(30) Foreign Application Priority Data

Mar. 17, 2020   (JP) ................................ 2020-046220

(51) Int. Cl.
*G11C 11/16* (2006.01)
*G11B 5/39* (2006.01)
(Continued)

(52) U.S. Cl.
CPC .......... *G11C 11/161* (2013.01); *G11B 5/3912* (2013.01); *G11C 11/1659* (2013.01);
(Continued)

(58) Field of Classification Search
None
See application file for complete search history.

(56) References Cited

U.S. PATENT DOCUMENTS

2003/0210586 A1  11/2003  Nakajima et al.
2008/0035958 A1   2/2008  Asao
(Continued)

FOREIGN PATENT DOCUMENTS

JP    2004-006713 A    1/2004
JP    2006-210396 A    8/2006
(Continued)

OTHER PUBLICATIONS

International Search Report issued in International Patent Application No. PCT/JP2021/005127 on May 18, 2021 and English translation of same. 7 pages.

(Continued)

*Primary Examiner* — Tan T. Nguyen
(74) *Attorney, Agent, or Firm* — K&L Gates LLP

(57) ABSTRACT

A semiconductor apparatus includes a nonvolatile memory cell array including a plurality of first memory cells and a plurality of second memory cells including a first memory element 11 and a second memory element 12 including a resistance-variable nonvolatile memory element and a first selection transistor electrically connected to the first memory element 11 and the second memory element 12, in which a plurality of first memory elements 11 and a plurality of second memory elements 12 are arranged in a two-dimensional matrix in a first direction and a second direction different from the first direction and on the same interlayer insulating layer, the first memory element 11 is larger than the second memory element 12, and the first memory element 11 and the second memory element 12 are disposed adjacent to each other along the second direction.

20 Claims, 25 Drawing Sheets

(51) Int. Cl.
    *H10B 61/00*     (2023.01)
    *H10N 50/01*     (2023.01)
    *H10N 50/10*     (2023.01)

(52) U.S. Cl.
    CPC .............. *H10B 61/22* (2023.02); *H10N 50/01* (2023.02); *H10N 50/10* (2023.02)

(56) References Cited

U.S. PATENT DOCUMENTS

| | | |
|---|---|---|
| 2008/0315335 A1 | 12/2008 | Ueda |
| 2015/0280121 A1* | 10/2015 | Liao .................... H10N 70/011 257/4 |
| 2019/0066763 A1 | 2/2019 | Apodaca |

FOREIGN PATENT DOCUMENTS

| | | |
|---|---|---|
| JP | 2008-042090 A | 2/2008 |
| JP | 2008-065953 A | 3/2008 |
| JP | 2009-004440 A | 1/2009 |
| JP | 2012-014787 A | 1/2012 |
| WO | WO2010/143248 A1 | 12/2010 |

OTHER PUBLICATIONS

Written Opinion issued in International Patent Application No. PCT/JP2021/005127 on May 18, 2021. 6 pages.

\* cited by examiner

SEMICONDUCTOR APPARATUS AND METHOD FOR MANUFACTURING THE SAME

CROSS REFERENCE TO RELATED APPLICATIONS

The present application is a National Stage of International Application No. PCT/JP2021/005127, filed on Feb. 11, 2021, which claims priority to Japanese Patent Application No. 2020-046220, filed on Mar. 17, 2020, the entire contents of which are being incorporated herein by reference.

TECHNICAL FIELD

The present disclosure relates to a semiconductor apparatus and a method for manufacturing the same.

BACKGROUND ART

Along with the rapid development of various information equipment from large-capacity servers to mobile terminals, further improvement in performance such as higher integration, higher speed, lower power consumption, and the like has been pursued in various elements such as memories, logics, and the like constituting the information equipment. In particular, the progress of semiconductor nonvolatile memories is remarkable, and for example, flash memories as large-capacity file memories are spreading at a speed of expelling hard disk drives. On the other hand, in view of the development for code storage and working memory, ferroelectric random access memory (FeRAM), magnetic random access memory (MRAM), phase-change random access memory (PCRAM), and the like have been developed to replace currently generally used NOR flash memory, DRAM, and the like, and some of them have already been put into practical use.

Among them, since the MRAM stores data on the basis of the magnetization direction of a magnetic body, it is possible to perform high-speed and almost infinite ($10^{15}$ times or more) rewriting, and the MRAM has already been used in the fields of industrial automation, aircraft, and the like. Then, the MRAM is expected to be developed for code storage and working memory in the future because of its high-speed operation and high reliability. However, in reality, there are problems of low power consumption and large capacity. This is an essential problem caused by the recording principle of the MRAM, that is, a method of reversing the magnetization by the current magnetic field generated from the wiring. As a means for solving this problem, a recording method that does not depend on the current magnetic field, that is, a magnetization reversal method has been studied, and among them, spin transfer torque based magnetic random access memory (STT-MRAM) to which magnetization reversal by spin transfer is applied has attracted attention.

Similarly to the MRAM, the spin transfer torque based magnetic random access memory (hereinafter, simply referred to as a "nonvolatile memory element") includes, for example, a magnetic tunnel junction (MTJ), and uses application of torque to a storage layer when a spin-polarized electron having passed through a magnetic layer fixed in a certain direction enters another magnetic layer (a magnetic layer whose magnetization direction is not fixed, and is also referred to as a "free layer" or a "storage layer"), and when a current equal to or larger than a certain threshold value flows, the magnetization direction of the storage layer is reversed. The data of "0/1" is rewritten by changing the polarity of the current (the flow direction in which the current passes through the storage layer). Then, the absolute value of the current for this reversal is 1 milliampere or less in a nonvolatile memory element of a scale of about 0.1 µm, and this current value decreases in proportion to the volume of the nonvolatile memory element, and thus scaling is possible. In addition, since a word line for generating a recording current magnetic field, which is required in the MRAM, is not required, there is also an advantage that a cell structure is simplified. Various materials have been studied as a ferromagnetic body used in a nonvolatile memory element, but in general, a nonvolatile memory element having perpendicular magnetic anisotropy is considered to be more suitable for reducing power and increasing capacity than a nonvolatile memory element having in-plane magnetic anisotropy. This is because the perpendicular magnetization has a lower energy barrier to be exceeded at the time of spin torque magnetization reversal, and the high magnetic anisotropy of a perpendicular magnetization film is advantageous for maintaining the thermal stability of a storage carrier miniaturized by increasing the capacity.

Meanwhile, in order to apply the nonvolatile memory element to various uses, there is a demand for a nonvolatile memory cell array in which a plurality of types (for example, two types) of nonvolatile memory elements having different thermal stability, in other words, different storage holding characteristics and data writing characteristics is mixedly mounted. However, for example, as disclosed in Japanese Patent Application Laid-Open No. 2012-014787, in a case where nonvolatile memory elements having different thermal stability are formed in the same wafer, it is necessary to form optimized nonvolatile memory elements a plurality of times, and thus there is a problem that the number of steps increases. On the other hand, as a means for making the storage holding characteristics of the nonvolatile memory elements different, examples include a method of making the sizes of the nonvolatile memory elements.

CITATION LIST

Patent Document

Patent Document 1: Japanese Patent Application Laid-Open No. 2012-014787

SUMMARY OF THE INVENTION

Problems to be Solved by the Invention

However, in a case where the size of the nonvolatile memory element is large, when the interval (formation pitch) between adjacent nonvolatile memory elements is narrowed to an allowable minimum formation pitch in order to reduce the nonvolatile memory cell array, when a stack film for forming the nonvolatile memory elements is formed and then the stack film is patterned (for example, etched) to form nonvolatile memory, residues of the patterned (for example, etched) stack film are redeposited, and as a result, there is a possibility that a short circuit occurs between the adjacent nonvolatile memory elements. Furthermore, by dividing a region (memory block) in which a large nonvolatile memory element is to be formed from a region (memory block) in which a small nonvolatile memory element is to be formed, the area of the entire nonvolatile memory cell array cannot be reduced. Moreover, when excessive etching is attempted on the stack film in order to prevent occurrence of a short circuit between adjacent nonvolatile memory elements, there is a possibility of causing damage to constituent elements of the nonvolatile memory cell array located below the stack film, for example, wiring and a selection transistor.

Thus, an object of the present disclosure is to provide a semiconductor apparatus including a nonvolatile memory cell array having a configuration and a structure in which a problem hardly occurs even when an interval (formation pitch) between adjacent nonvolatile memory elements is narrowed, and a method for manufacturing the semiconductor apparatus.

Solutions to Problems

A semiconductor apparatus according to first to second aspects of the present disclosure for achieving the object described above includes:

a nonvolatile memory cell array including a plurality of first memory cells, each of the plurality of first memory cells including a first memory element including a resistance-variable nonvolatile memory element and a first selection transistor electrically connected to the first memory element; and a plurality of second memory cells, each of the plurality of second memory cells including a second memory element including a resistance-variable nonvolatile memory element and a second selection transistor electrically connected to the second memory element.

Then, in the semiconductor apparatus according to the first aspect of the present disclosure, the plurality of first memory elements and the plurality of second memory elements are arranged in a two-dimensional matrix in a first direction and a second direction different from the first direction and on the same interlayer insulating layer, the first memory element is larger than the second memory element, and the first memory element and the second memory element are disposed adjacent to each other along the second direction.

Furthermore, in the semiconductor apparatus according to the second aspect of the present disclosure, the plurality of first memory elements and the plurality of second memory elements are arranged in a two-dimensional matrix in a first direction and a second direction different from the first direction, the first memory element is formed on a first interlayer insulating layer, the second memory element is formed on a second interlayer insulating layer located above the first interlayer insulating layer, and the first memory element and the second memory element are disposed such that an orthographic projection image of the second memory element on the first interlayer insulating layer and the first memory element are located adjacent to each other along the second direction.

A method for manufacturing a semiconductor apparatus of the present disclosure for achieving the object described above, the apparatus including a nonvolatile memory cell array including a plurality of first memory cells, each of the plurality of first memory cells including a first memory element including a resistance-variable nonvolatile memory element and a first selection transistor electrically connected to the first memory element, and a plurality of second memory cells, each of the plurality of second memory cells including a second memory element including a resistance-variable nonvolatile memory element and a second selection transistor electrically connected to the second memory element, in which a plurality of first memory elements and a plurality of second memory elements are arranged in a two-dimensional matrix in a first direction and a second direction different from the first direction and on the same interlayer insulating layer, the first memory element is larger than the second memory element, the first memory element and the second memory element are disposed adjacent to each other along the second direction, the method including at least each step of:

forming the first selection transistor and the second selection transistor constituting the first memory cell and the second memory cell on a base portion, and then forming an interlayer insulating layer on an entire surface, and then forming, on the interlayer insulating layer, a stack film for forming the nonvolatile memory element electrically connected to the first selection transistor and the second selection transistor constituting the first memory cell and the second memory cell, and then patterning the stack film to form the first memory element and the second memory element.

MODE FOR CARRYING OUT THE INVENTION

Figure 1:
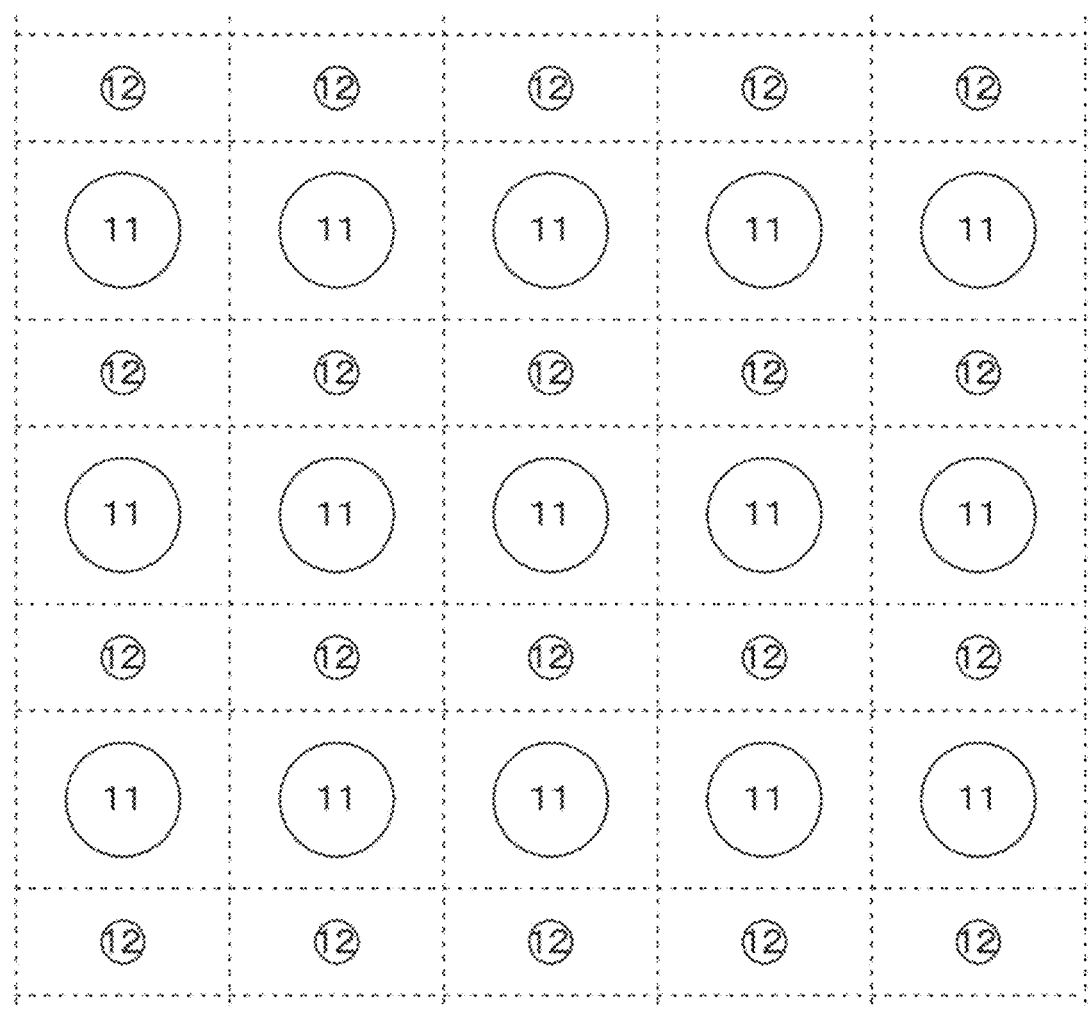
FIG. 1 is a diagram schematically illustrating a disposition state of first memory elements and second memory elements in a nonvolatile memory cell array constituting a semiconductor apparatus of a first example.

Hereinafter, the present disclosure will be described on the basis of examples with reference to the drawings, but the present disclosure is not limited to the examples, and various numerical values and materials in the examples are examples. Note that the description is provided in the order set forth below.

1. General description of the semiconductor apparatus according to first to second aspects of the present disclosure and the method for manufacturing the semiconductor apparatus of the present disclosure
2. First example (semiconductor apparatus according to the first aspect of the present disclosure, nonvolatile memory cell array of first-A aspect, and method for manufacturing the semiconductor apparatus of the present disclosure)
3. Second example (modification of the first example, nonvolatile memory cell array of first-B aspect)
4. Third example (semiconductor apparatus according to the second aspect of the present disclosure)
5. Fourth example (modification of the third example)
6. Fifth example (another modification of the third example)
7. Sixth example (application example of the nonvolatile memory cell array of the first to fifth examples)
8. Other <General description of the semiconductor apparatus according to first to second aspects of the present disclosure and the method for manufacturing the semiconductor apparatus of the present disclosure>

The first memory element and the second memory element do not need to be disposed adjacent to each other along a second direction in the entire region of the nonvolatile memory cell array constituting the semiconductor apparatus according to the first aspect of the present disclosure (hereinafter, sometimes referred to as the "nonvolatile memory cell array of the first aspect of the present disclosure"). That is, it is sufficient if the first memory element and the second memory element are disposed adjacent to each other along the second direction in at least a partial region of the nonvolatile memory cell array of the first aspect of the present disclosure. Similarly, the first memory element and the second memory element do not need to be disposed such that an orthographic projection image of the second memory element on a first interlayer insulating layer and the first memory element are located adjacent to each other along the second direction in the entire region of the nonvolatile memory cell array constituting the semiconductor apparatus according to the second aspect of the present disclosure (hereinafter, sometimes referred to as the "nonvolatile memory cell array of the second aspect of the present disclosure"). That is, it is sufficient if the first memory element and the second memory element are disposed such that the orthographic projection image of the second memory element on the first interlayer insulating layer and the first memory element are located adjacent to each other along the second direction in at least a partial region of the nonvolatile memory cell array of the second aspect of the present disclosure.

Furthermore, in the nonvolatile memory cell array of the first to second aspects of the present disclosure, the formation pitches of the first memory element and the second memory element are as described below. Note that the first direction and the second direction are preferably orthogonal to each other. Here, the formation pitch of a memory element and a memory element refers to a distance between center points of adjacent memory elements along a specified direction when an area centroid point of the memory element is the center point.

$P_{1-11}$: Formation pitch of the first memory element and the first memory element along the first direction $P_{1-22}$: Formation pitch of the second memory element and the second memory element along the first direction $P_{1-12}$: Formation pitch of the first memory element and the second memory element along the first direction (nonvolatile memory cell array of the first aspect of the present disclosure)

$P_{1-12}'$: Formation pitch of the orthographic projection image of the second memory element on the first interlayer insulating layer and the first memory element along the first direction (nonvolatile memory cell array of the second aspect of the present disclosure)

$P_{2-11}$: Formation pitch of the first memory element and the first memory element along the second direction $P_{2-22}$: Formation pitch of the second memory element and the second memory element along the second direction $P_{2-12}$: Formation pitch of the first memory element and the second memory element along the second direction (nonvolatile memory cell array of the first aspect of the present disclosure)

$P_{2-12}'$: Formation pitch of the orthographic projection image of the second memory element on the first interlayer insulating layer and the first memory element along the second direction (nonvolatile memory cell array of the second aspect of the present disclosure)

Here, in the nonvolatile memory cell array of the first aspect of the present disclosure, the formation pitches $P_{2-12}$ and $P_{2-12}'$ of the first memory element and the second memory element along the second direction are the smallest among the formation pitches $P_{1-11}$, $P_{1-22}$, $P_{1-12}$, $P_{2-11}$, $P_{2-22}$, $P_{2-12}$, and $P_{2-12}'$.

In the nonvolatile memory cell array of the first aspect of the present disclosure or a nonvolatile memory cell array constituting a semiconductor apparatus manufactured by the method for manufacturing a semiconductor apparatus of the present disclosure (hereinafter, these nonvolatile memory cell arrays may be collectively referred to as the "nonvolatile memory cell array of the first aspect of the present disclosure"), a first memory element group including a plurality of first memory elements is arranged along the first direction, and a second memory element group including a plurality of second memory elements is arranged along the first direction, and the first memory element group and the second memory element group can be in a form of being alternately arranged along the second direction. The nonvolatile memory cell array of the first aspect of the present disclosure in such a form may be referred to as the "nonvolatile memory cell array of the first-A aspect" for convenience.

When the area of the first memory element $S_1$ and the area of the second memory element is $S_2$, the nonvolatile memory cell array of the first-A aspect can be configured to satisfy $1 < S_1/S_2 \leq 10$.

Then, in this case, when the formation pitch of the first memory element and the second memory element along the second direction is $P_{2-12}$, it can be configured to satisfy $1.1 \leq P_{2-12}/R_1 \leq 10$, preferably, $1.3 \leq P_{2-12}/R_1 \leq 10$.

However, $S_1 = \Pi(R_1/2)^2$.

Then, moreover, when the formation pitch of the first memory element and the first memory element along the first direction is $P_{1-12}$, it can be configured to satisfy $2 \leq P_{1-12}/R_1 \leq 20$.

Alternatively, in the nonvolatile memory cell array of the first aspect of the present disclosure, the first memory element and the second memory element can be in a form of being alternately arranged along the first direction. The nonvolatile memory cell array of the first aspect of the present disclosure in such a form may be referred to as the "nonvolatile memory cell array of the first-B aspect" for convenience.

When the area of the first memory element $S_1$ and the area of the second memory element is $S_2$, the nonvolatile memory cell array of the first-B aspect can be configured to satisfy $1 < S_1/S_2 \leq 10$. Then, in this case, when the formation pitch of the first memory element and the second memory element along the first direction is $P_{1-12}'$ and the formation pitch of the first memory element and the second memory element along the second direction is $P_{2-12}'$, it can be configured to satisfy $2 \leq P_{1-12}'/R_1 \leq 20$ $1 \leq P_{2-12}'/R_1 \leq 10$.

However, $S_1 = \Pi(R_1/2)^2$.

Moreover, in the nonvolatile memory cell array of the first aspect of the present disclosure including the various preferable forms and configurations described above, the first memory element and the second memory element can be in a form of having different thermal stability. For example, in a case where materials constituting the first memory element and the second memory element are different from each other, it is possible to verify the difference in a thickness of a storage layer (described later), a material constituting the storage layer, and an element composition by observing the cross section of the memory elements and performing physical and chemical analysis.

Meanwhile, in the nonvolatile memory cell array of the first aspect of the present disclosure, the first memory element having a large size has excellent thermal stability and can store and hold data for a long period of time. On the other hand, in the second memory element having a small size, data can be written at a higher speed than in the first memory element, and data can be written at a low current. Then, examples of use are such that in the second memory cell capable of writing and reading data at high speed, data is constantly written and read, and data is held or saved in the first memory cell having excellent data storage/holding characteristics for a long period of time.

In the nonvolatile memory cell array of the second aspect of the present disclosure, an orthographic projection image of the second memory element on the first interlayer insulating layer can be in a form of not overlapping the first memory element.

In the nonvolatile memory cell array of the second aspect of the present disclosure including the preferable form described above, the size of the orthographic projection image of the second memory element on the first interlayer insulating layer can be in a form of being different from the size of the first memory element. Moreover, in the nonvolatile memory cell array of the second aspect of the present disclosure including such a preferable form, the first interlayer insulating layer can be in a form of covering a first selection transistor and a second selection transistor, and a second interlayer insulating layer can be in a form of covering the first memory element and the first interlayer insulating layer. The size of the orthographic projection image of the second memory element on the first interlayer insulating layer may be larger than, smaller than, or the same as the size of the first memory element.

Moreover, in the nonvolatile memory cell array of the first aspect of the present disclosure including the various preferable forms and configurations described above, or in the nonvolatile memory cell array of the second aspect of the present disclosure including the various preferable forms described above, the first memory cell can be in a form of including one first memory element and one first selection transistor, and the second memory cell can be in a form of including one second memory element and one second selection transistor, or the first memory cell can be in a form of including one first memory element and two first selection transistors, and the second memory cell can be in a form of including one second memory element and two second selection transistors, or the first memory cell can be in a form of including two first memory elements and two first selection transistors, and the second memory cell can be in a form of including two second memory elements and two second selection transistors.

Moreover, in the nonvolatile memory cell array of the first aspect of the present disclosure including the various preferable forms and configurations described above, or in the nonvolatile memory cell array of the second aspect of the present disclosure including the various preferable forms described above, a memory cell and a memory cell adjacent along the first direction can be in a form of being isolated by a transistor (sometimes referred to as an "isolation transistor"). Note that the isolation transistor preferably has the same structure as the selection transistor.

Moreover, in the nonvolatile memory cell array of the first aspect of the present disclosure including the various preferable forms and configurations described above, or in the nonvolatile memory cell array of the second aspect of the present disclosure including the various preferable forms described above, the first memory element and the second memory element can be in a form of including perpendicular magnetization-type spin transfer torque based magnetic random access memory (hereinafter, sometimes simply referred to as "spin transfer torque based magnetic random access memory"). However, it is not limited to such a form, and it can be in a form in which the perpendicular magnetization-type magnetic random access memory and in-plane magnetization-type magnetic random access memory are mixed or a form of including in-plane magnetization type magnetic random access memory. In the spin transfer torque based magnetic random access memory, the magnetization direction of the storage layer changes according to information to be stored, and in the storage layer, the easy magnetization axis is, for example, parallel to the stacking direction of a stack structure.

Moreover, the semiconductor apparatus according to the first aspect of the present disclosure including the various preferable forms and configurations described above or the semiconductor apparatus according to the second aspect of the present disclosure including the various preferable forms described above can be in a form of further including a peripheral circuit, and a dummy stack structure having the same configuration as the stack structure constituting the first memory element and/or the second memory element is formed above the peripheral circuit. The peripheral circuit can be any circuit, and includes, for example, not only a circuit constituting memory, such as a sense amplifier and a driver for driving the selection transistor, but also other circuits in a case where the peripheral circuit is mixed with other circuits. More specifically, a dummy stack structure can be in a form of being formed above the gate electrode of the transistor constituting the peripheral circuit. As described later, the stack structure includes a stack structure including at least a magnetization fixed layer, an intermediate layer, and a storage layer, but the dummy stack structure can be configured to include a stack structure including a magnetization fixed layer, an intermediate layer, and a storage layer. It is preferable that an orthographic projection image of the gate electrode of the transistor constituting the peripheral circuit is included in an orthographic projection image of the dummy stack structure on the base portion. Alternatively, the peripheral circuit includes various wirings. More specifically, a dummy stack structure can be in a form of being formed above the wiring constituting the peripheral circuit. It is preferable that an orthographic projection image of the wiring constituting the peripheral circuit is included in the orthographic projection image of the dummy stack structure on the base portion. Alternatively, a form in which the dummy stack structure is widely formed on the interlayer insulating layer, the first interlayer insulating layer, and the second interlayer insulating layer covering the transistor and the wiring constituting the peripheral circuit can be adopted, and such a form is also included in a form in which the dummy stack structure is formed above the peripheral circuit. The dummy stack structure can be in a form of being not electrically connected to any place, or can be in a form of being grounded, for example. Then, by providing such a dummy stack structure, it is possible to unfailingly prevent the occurrence of damage in the peripheral circuit constituting the semiconductor apparatus due to the microloading effect, for example, when the stack film is patterned to obtain the stack structure.

In the nonvolatile memory cell array of the first aspect of the present disclosure including the various preferable forms and configurations described above, or in the nonvolatile memory cell array of the second aspect of the present disclosure including the various preferable forms described above, it is preferable that the first memory cell and the second memory cell, or the first memory element and the second memory element have the same configuration and structure except that the sizes of the nonvolatile memory elements are different. Furthermore, in the nonvolatile memory cell array of the first aspect of the present disclosure, materials constituting the first memory element and the second memory element are preferably the same. On the other hand, in the nonvolatile memory cell array of the second aspect of the present disclosure, materials constituting the first memory element and the second memory element are preferably the same, but may be different.

Moreover, in the nonvolatile memory cell array of the first aspect of the present disclosure including the various preferable forms and configurations described above, or in the nonvolatile memory cell array of the second aspect of the present disclosure including the various preferable forms described above (hereinafter, these nonvolatile memory cell arrays may be collectively and simply referred to as the "nonvolatile memory cell array of the present disclosure"), the gate electrode of the selection transistor can be in a form of being connected to the word line extending in the second direction (or serving as the word line). Furthermore, the projection image in the direction in which the bit line (second wiring) extends can be in a form of being orthogonal to the projection image in the direction in which the word line extends, and the direction in which the bit line (second wiring) extends can be in a form of being parallel to the direction in which the word line extends.

Moreover, in the nonvolatile memory cell array of the present disclosure including the various preferable forms and configurations described above, the selection transistor can be in a form of including a planar transistor, specifically, a field effect transistor (known MIS-FET or MOS-FET), or the selection transistor can be in a form of including a Fin-FET, and this makes it possible to suppress short channel characteristics. Alternatively, in the selection transistor, a channel formation region can be in a form of including a semiconductor element having a tri-gate structure or a semiconductor element having a gate-all-around (GAA) structure or an omega (Ω) structure (specifically, for example, an FET in which a channel formation region includes a nanowire or a nanosheet). The selection transistor may be an n-channel transistor or a p-channel transistor.

In the nonvolatile memory cell array of the present disclosure, the nonvolatile memory element includes at least a storage layer and a magnetization fixed layer, and the magnetization fixed layer can be in a form of being connected to one source/drain region of the selection transistor, or the storage layer can be in a form of being connected to one source/drain region of the selection transistor. The nonvolatile memory element including the spin transfer torque based magnetic random access memory includes at least the storage layer and the magnetization fixed layer as described above, but specifically, the nonvolatile memory element can be configured to include the stack structure including at least the magnetization fixed layer, the intermediate layer, and the storage layer. Then, a first surface (surface facing the selection transistor) of the stack structure is connected to a conductive underlying layer, and a second surface (surface facing the first surface) of the stack structure is in contact with the second wiring (bit line). The underlying layer is connected to one source/drain region of the selection transistor. Specifically, the underlying layer is connected to a contact hole coupling the one source/drain region of the selection transistor to the stack structure. That is, the one source/drain region of the selection transistor and the stack structure are electrically connected by the contact hole. Another source/drain region of the selection transistor is connected to a sense line (first wiring). Then, a form in which information is stored in the storage layer by causing current (magnetization reversal current, also called spin polarization current, it is write current) to flow between the first wiring and the second wiring can be adopted. That is, a form in which when the magnetization reversal current is caused to flow in the stacking direction of the stack structure, the magnetization direction of the storage layer is changed and information is recorded in the storage layer can be adopted.

As described above, the magnetization fixed layer can be in a form of being connected to the one source/drain region of the selection transistor via the underlying layer. That is, the magnetization fixed layer can be in a form of constituting the first surface of the stack structure, so that a material-stable stack structure can be obtained. However, it is not limited thereto, and as described above, the storage layer can be in a form of constituting the first surface of the stack structure.

The spin transfer torque based magnetic random access memory can have a structure in which the stack structure having a tunnel magnetoresistance (TMR) effect or a giant magnetoresistance (GMR) effect includes the stack structure including the storage layer, the intermediate layer, and the magnetization fixed layer as described above. Then, for example, when the magnetization reversal current (spin polarization current, write current) is caused to flow from the storage layer to the magnetization fixed layer in the magnetization state of the antiparallel disposition, the magnetization of the storage layer is reversed by the spin torque acting as electrons are injected from the magnetization fixed layer to the storage layer, and the magnetization direction of the storage layer, the magnetization direction of the magnetization fixed layer (specifically, a reference layer), and the magnetization direction of the storage layer are arranged in parallel. On the other hand, for example, when the magnetization reversal current is caused to flow from the magnetization fixed layer to the storage layer in the magnetization state of parallel disposition, the magnetization of the storage layer is reversed by the spin torque acting as electrons flow from the storage layer to the magnetization fixed layer, and the magnetization direction of the storage layer and the magnetization direction of the magnetization fixed layer (specifically, the reference layer) become antiparallel arrangement. Alternatively, as illustrated in the conceptual diagram of FIG. 6B, a structure in which the stack structure having the TMR effect or the GMR effect includes the magnetization fixed layer, the intermediate layer, the storage layer, the intermediate layer, and the magnetization fixed layer (double spin filter structure) can be adopted. In such a structure, it is necessary to make a difference in change in magnetoresistance between the two intermediate layers located above and below the storage layer.

Here, the metal atoms constituting the magnetization fixed layer and the storage layer can be in a form of including cobalt (Co) atoms, iron (Fe) atoms, or cobalt atoms and iron atoms (Co—Fe). In other words, the metal atoms constituting the magnetization fixed layer and the storage layer can be in a form of including at least cobalt (Co) atoms or iron (Fe) atoms. That is, the magnetization fixed layer and the storage layer can be in a form of including a metal material (alloy, compound) including at least cobalt (Co) or iron (Fe).

Alternatively, the storage layer includes at least one metal material (alloy, compound) selected from the group consisting of cobalt, iron, and nickel, and preferably the storage layer includes a metal material (alloy, compound) including cobalt, iron, and nickel, or can be in a form of including a metal material (alloy, compound) including cobalt, iron, nickel, and boron. Alternatively, examples of the material constituting the storage layer can include an alloy (for example, Co—Fe, Co—Fe—B, Co—Fe—Ni, Fe—Pt, Ni—

Fe, Fe—B, Co—B, and the like) of a ferromagnetic material such as nickel (Ni), iron (Fe), or cobalt (Co), or an alloy obtained by adding gadolinium (Gd) to these alloys. Moreover, in the perpendicular magnetization type, in order to further increase perpendicular magnetic anisotropy, heavy rare earths such as terbium (Tb), dysprosium (Dy), and holmium (Ho) may be added to such alloys, or an alloy including these may be stacked. The crystallinity of the storage layer is essentially arbitrary, and may be polycrystalline, monocrystalline, or amorphous. Furthermore, the storage layer can have a single-layer configuration, a multilayer configuration in which a plurality of different ferromagnetic material layers is stacked, or a multilayer configuration in which a ferromagnetic material layer and a non-magnetic body layer are stacked.

Furthermore, it is also possible to add a non-magnetic element to the material constituting the storage layer. By adding the non-magnetic element, effects such as improvement in heat resistance due to prevention of diffusion, an increase in the magnetoresistance effect, and an increase in dielectric strength due to flattening can be obtained. Examples of the non-magnetic element to be added include B, C, N, O, F, Li, Mg, Si, P, Ti, V, Cr, Mn, Ni, Cu, Ge, Nb, Ru, Rh, Pd, Ag, Ta, Ir, Pt, Au, Zr, Hf, W, Mo, Re, and Os.

Moreover, ferromagnetic material layers having different compositions can be stacked as the storage layer. Alternatively, it is also possible to stack a ferromagnetic material layer and a soft magnetic material layer, or to stack a plurality of ferromagnetic material layers via a soft magnetic material layer or a non-magnetic body layer. In particular, in a case of a configuration in which a plurality of ferromagnetic material layers such as an Fe layer, a Co layer, an Fe—Ni alloy layer, a Co—Fe alloy layer, a Co—Fe—B alloy layer, an Fe—B alloy layer, and a Co—B alloy layer is stacked via a non-magnetic body layer, it is possible to adjust the relationship in magnetic strength between the ferromagnetic material layers, and thus, it is possible to suppress the magnetization reversal current (also referred to as spin polarization current) in the spin transfer torque based magnetic random access memory. Examples of the material of the non-magnetic body layer include Ru, Os, Re, Ir, Au, Ag, Cu, Al, Bi, Si, B, C, Cr, Ta, Pd, Pt, Zr, Hf, W, Mo, Nb, V, and alloys thereof.

The thickness of the storage layer can be exemplified to be 0.5 nm to 30 nm, and the thickness of the magnetization fixed layer can be exemplified to be 0.5 nm to 30 nm.

The magnetization fixed layer can be in a form of having a multilayered ferri-structure (also referred to as a multilayered ferri-pinned structure) in which at least two magnetic material layers are stacked. One magnetic material layer constituting the multilayered ferri-structure may be referred to as a "reference layer", and the other magnetic material layer constituting the multilayered ferri-structure may be referred to as a "fixed layer". The multilayered ferri-structure is a multilayered structure having antiferromagnetic coupling, that is, a structure in which interlayer exchange coupling between two magnetic material layers (reference layer and fixed layer) becomes antiferromagnetic, and is also referred to as synthetic antiferromagnetic (SAF) coupling, refers to a structure in which the interlayer exchange coupling between two magnetic material layers becomes antiferromagnetic or ferromagnetic depending on the thickness of a non-magnetic layer provided between the two magnetic material layers (reference layer and fixed layer), and is reported in, for example, S. S. Parkin et. al, Physical Review Letters, 7 May, pp 2304-2307 (1990). The magnetization direction of the reference layer is a magnetization direction serving as a reference of information to be stored in the storage layer. One magnetic material layer (reference layer) constituting the multilayered ferri-structure is located on the storage layer side. That is, the reference layer is in contact with the intermediate layer. By adopting the multilayered ferri-structure (also referred to as the multilayered ferri-pinned structure) for the magnetization fixed layer, asymmetry of thermal stability with respect to an information writing direction can be unfailingly canceled, and stability with respect to spin torque can be improved.

Then, one magnetic material layer (for example, reference layer) constituting the multilayered ferri-structure includes at least one element selected from the group consisting of iron (Fe), cobalt (Co), and nickel (Ni), or includes at least one element selected from the group consisting of iron (Fe), cobalt (Co), and nickel (Ni), and boron (B). Specifically, a Co—Fe alloy, a Co—Fe—Ni alloy, a Ni—Fe alloy, and a Co—Fe—B alloy can be exemplified, and a multilayered structure such as Fe layer/Pt layer, Fe layer/Pd layer, Co layer/Pt layer, Co layer/Pd layer, Co layer/Ni layer, and Co layer/Rh layer can be exemplified, and to these materials, non-magnetic elements such as Ag, Cu, Au, Al, Si, Bi, Ta, B, C, O, N, Pd, Pt, Zr, Ta, Hf, Ir, W, Mo, Nb, V, Ru, and Rh may be added to adjust magnetic characteristics, or various physical properties such as crystal structure, crystallinity, and stability of a substance may be adjusted.

On the other hand, the other magnetic material layer (for example, fixed layer) constituting the multilayered ferri-structure can be in a form of including a material including, as a main component, at least one element (referred to as "element-A" for convenience) selected from the group consisting of iron (Fe), cobalt (Co), nickel (Ni), and manganese (Mn), and at least one element (however, it is an element different from the above-described element-A, and is referred to as "element-B" for convenience) selected from the group consisting of platinum (Pt), palladium (Pd), nickel (Ni), manganese (Mn), iridium (Ir), and rhodium (Rh).

Moreover, examples of the material constituting the non-magnetic layer can include ruthenium (Ru), an alloy thereof, and a ruthenium compound, or can include Os, Re, Ir, Au, Ag, Cu, Al, Bi, Si, B, C, Cr, Ta, Pd, Pt, Zr, Hf, W, Mo, Nb, V, Rh, Ti, and alloys thereof.

Alternatively, the fixed layer can include a multilayered structure of Co thin film/Pt thin film, the reference layer can have a multilayered structure of Co thin film/Pt thin film/CoFeB thin film (however, the CoFeB thin film is in contact with the intermediate layer) in order to increase the MR ratio, and a non-magnetic layer including, for example, Ru can be configured to be disposed between the fixed layer and the reference layer.

However, the magnetization fixed layer is not limited to a form having the multilayered ferri-structure. The magnetization fixed layer including one layer and functioning as a reference layer can also be adopted. Examples of the material constituting such a magnetization fixed layer can include a material (ferromagnetic material) constituting the storage layer, alternatively, the magnetization fixed layer (reference layer) can include a stack of a Co layer and a Pt layer, a stack of a Co layer and a Pd layer, a stack of a Co layer and a Ni layer, a stack of a Co layer and a Tb layer, a Co—Pt alloy layer, a Co—Pd alloy layer, a Co—Ni alloy layer, a Co—Fe alloy layer, a Co—Tb alloy layer, a Co layer, an Fe layer, or a Co—Fe—B alloy layer, or alternatively, an non-magnetic element such as Ag, Cu, Au, Al, Si, Bi, Ta, B, C, O, N, Pd, Pt, Zr, Hf, Ir, W, Mo, Nb, V, Ru, and Rh may be added to these materials to adjust magnetic characteristics, or adjust various physical properties such as crystal structure, crystallinity, and stability of a substance, and moreover, preferably, the magnetization fixed layer (reference layer) can include a Co—Fe—B alloy layer.

Alternatively, the magnetization fixed layer can be configured to have a fixed magnetization orientation by using antiferromagnetic coupling between an antiferromagnetic layer and a ferromagnetic layer. Specific examples of an antiferromagnetic material include an Fe—Mn alloy, an Fe—Pt alloy, a Ni—Mn alloy, a Pt—Mn alloy, a Pt—Cr—Mn alloy, an Ir—Mn alloy, a Rh—Mn alloy, a Co—Pt alloy, a cobalt oxide, a nickel oxide (NiO), and an iron oxide ($Fe_2O_3$). Alternatively, a non-magnetic element such as Ag, Cu, Au, Al, Si, Bi, Ta, B, C, O, N, Pd, Pt, Zr, Ta, Hf, Ir, W, Mo, Nb, V, Ru, and Rh may be added to these materials to adjust magnetic characteristics or various physical properties such as crystal structure, crystallinity, and stability of a substance. Examples of the material constituting the non-magnetic layer can include ruthenium (Ru), an alloy thereof, and a ruthenium compound, or can include Os, Re, Ir, Au, Ag, Cu, Al, Bi, Si, B, C, Cr, Ta, Pd, Pt, Zr, Hf, W, Mo, Nb, V, Rh, and alloys thereof.

Since the magnetization direction of the magnetization fixed layer is a reference of information, the magnetization direction should not be changed by recording or reading of information, but the magnetization direction is not necessarily fixed in a specific direction, and it is sufficient if the magnetization direction is configured and structured to be less likely to change as compared with that of the storage layer by increasing the coercive force, increasing the film thickness, or increasing the magnetic damping constant than the storage layer.

The intermediate layer preferably includes a non-magnetic body material. That is, in the spin transfer torque based magnetic random access memory, the intermediate layer in the case of constituting the stack structure having the TMR effect preferably includes an insulating material and a non-magnetic body material. The stack structure having the TMR effect including the magnetization fixed layer, the intermediate layer, and the storage layer means a structure in which the intermediate layer including a non-magnetic body material film functioning as a tunnel insulating film is sandwiched between the magnetization fixed layer including a magnetic material and the storage layer including a magnetic material. Here, examples of the material that is an insulating material and a non-magnetic body material include various insulating materials, dielectric materials, and semiconductor materials, such as magnesium oxide (MgO), magnesium nitride, magnesium fluoride, aluminum oxide ($AlO_x$), aluminum nitride (AlN), silicon oxide ($SiO_x$), silicon nitride (SiN), $TiO_2$, $Cr_2O_3$, Ge, NiO, $CdO_x$, $HfO_2$, $Ta_2O_5$, $Bi_2O_3$, $CaF_2$, $SrTiO_2$, $AlLaO_3$, Mg—$Al_2$—O, Al—N—O, BN, and ZnS.

The area resistance value of the intermediate layer including an insulating material is preferably about several tens $\Omega\text{-}\mu m^2$ or less. In a case where the intermediate layer includes magnesium oxide (MgO), the MgO layer is desirably crystallized, and more desirably has crystal orientation in the (001) direction. Furthermore, in a case where the intermediate layer includes magnesium oxide (MgO), the thickness thereof is desirably 1.5 nm or less. On the other hand, examples of a material constituting the non-magnetic body material film constituting the stack structure having the GMR effect can include a conductive material such as Cu, Ru, Cr, Au, Ag, Pt, Ta, or an alloy thereof, and when conductivity is high (resistivity is several hundred $\mu\Omega\text{-}cm$ or less), an arbitrary non-metal material may be used, but it is desirable to appropriately select a material that hardly causes an interface reaction with the storage layer or the magnetization fixed layer.

The intermediate layer including an insulating material and a non-magnetic body material can be obtained, for example, by oxidizing or nitriding a metal layer (metal film) formed by a sputtering method. More specifically, in the case of using aluminum oxide ($AlO_x$) or magnesium oxide (MgO) as the insulating material constituting the intermediate layer, for example, a method of oxidizing aluminum or magnesium formed by a sputtering method in the atmosphere, a method of plasma-oxidizing aluminum or magnesium formed by a sputtering method, a method of oxidizing aluminum or magnesium formed by a sputtering method with IPC plasma, a method of naturally oxidizing aluminum or magnesium formed by a sputtering method in oxygen, a method of oxidizing aluminum or magnesium formed by a sputtering method with oxygen radicals, a method of emitting ultraviolet rays when naturally oxidizing aluminum or magnesium formed by a sputtering method in oxygen, a method of forming a film of aluminum or magnesium by a reactive sputtering method, and a method of forming a film of aluminum oxide ($AlO_x$) or magnesium oxide (MgO) by a sputtering method can be exemplified.

The three-dimensional shape of the stack structure is desirably a cylindrical shape or a columnar shape from the viewpoint of ensuring ease of processing and uniformity in the direction of the easy magnetization axis in the storage layer, but is not limited thereto, and may be a triangular prism, a quadrangular prism, a hexagonal prism, an octagonal prism, or the like (including those in which the side edge or the side ridge is rounded), or an elliptic prism. The area of the stack structure is preferably, for example, 0.01 $\mu m^2$ or less from the viewpoint of easily reversing the magnetization orientation with a low magnetization reversal current. Information is written in the storage layer by causing the magnetization reversal current to flow to the stack structure from the first wiring (sense line) to the second wiring (bit line) or from the second wiring (bit line) to the first wiring (sense line) to cause the magnetization direction in the storage layer to be a direction parallel to the easy magnetization axis or a direction opposite to the easy magnetization axis.

The underlying layer is provided for improving the crystallinity of the magnetic material layer constituting the stack structure, and includes Ta, Cr, Ru, Ti, or the like. Furthermore, a cap layer can be in a form of being provided between the second wiring (bit line) and the stack structure in order to prevent mutual diffusion between the second wiring (bit line) and atoms constituting the stack structure, reduce contact resistance, and prevent oxidation of the stack structure. However, in some cases, the bit line may be directly connected to the stack structure. Then, in this case, the cap layer can be in a form of including a single-layer structure including at least one material selected from the group consisting of hafnium, tantalum, tungsten, zirconium, niobium, molybdenum, titanium, vanadium, chromium, magnesium, ruthenium, rhodium, palladium, and platinum; single-layer structure including oxides such as a magnesium oxide layer, an aluminum oxide layer, a titanium oxide layer, a silicon oxide layer, a $Bi_2O_3$ layer, a $SrTiO_2$ layer, an $AlLaO_3$ layer, an Al—N—O layer, a Mg—Ti—O layer, and a $MgAl_2O_4$ layer; or a multilayered structure (for example, Ru layer/Ta layer) of at least one material layer selected from the group consisting of hafnium, tantalum, tungsten, zirconium, niobium, molybdenum, titanium, vanadium, chromium, magnesium, ruthenium, rhodium, palladium, and platinum, and at least one oxide layer selected from the group consisting of MgTiO, MgO, AlO, and SiO.

The various layers described above can be formed by, for example, a physical vapor deposition method (PVD method) exemplified by a sputtering method, an ion beam deposition method, and a vacuum vapor deposition method, and a chemical vapor deposition method (CVD method) typified by an atomic layer deposition (ALD) method. Furthermore, patterning of these layers can be performed by a reactive ion etching method (RIE method) or an ion milling method (ion beam etching method). The various layers are preferably formed continuously in a vacuum apparatus, preferably followed by patterning.

The underlying layer, the second wiring (bit line), the first wiring (sense line), various other wirings, wiring layers, and the like may have a single-layer structure of Ta or TaN, Cu, Al, Au, Pt, Ti, Ru, W, or the like, or a compound thereof, or may have a multilayered structure of an underlying film including Cr, Ti, or the like, and a Cu layer, an Au layer, a Pt layer, or the like formed thereon. Alternatively, it can also include a single-layer structure of Ta or a compound thereof, or a multilayered structure of Cu, Ti, or the like or a compound thereof. These electrodes and the like can be formed by, for example, a PVD method exemplified by a sputtering method.

The contact hole, a connection hole, and a pad portion electrically connecting the underlying layer and the source/drain region of the selection transistor can include polysilicon doped with impurities, a high melting point metal such as tungsten, Ti, Pt, Pd, Cu, TiW, TiNW, WSi$_2$, or MoSi$_2$, or a metal silicide, and can be formed on the basis of a CVD method or a PVD method exemplified by a sputtering method. A barrier metal layer is formed on an inner wall or a bottom of the contact hole or the connection hole. Furthermore, examples of a material constituting various insulating layers and various interlayer insulating layers include silicon oxide (SiO$_2$), silicon nitride (SiN), SiON, SiOC, SiOF, SiCN, spin on glass (SOG), non-doped silicate glass (NSG), borophosphosilicate glass (BPSG), PSG, BSG, PbSG, AsSG, SbSG, LTO, and Al$_2$O$_3$. Alternatively, examples include a low dielectric constant insulating material (for example, fluorocarbon, cycloperfluorocarbon polymer, benzocyclobutene, cyclic fluororesin, polytetrafluoroethylene, amorphous tetrafluoroethylene, polyaryl ether, fluorinated aryl ether, fluorinated polyimide, organic SOG, parylene, fluorinated fullerene, amorphous carbon), a polyimide-based resin, a fluorine-based resin, Silk (a trademark of The Dow Chemical Co. and a coating-type low-dielectric-constant interlayer insulating film material), and Flare (a trademark of Honeywell Electronic Materials Co. and a polyaryl ether (PAE)-based material), and these can be used alone or in combination as appropriate. Alternatively, a high-K (high dielectric constant) film (for example, Hf oxide, Al$_2$O$_3$, Ru oxide, Ta oxide, Si oxide including Al, Ru, Ta, and Hf, Si nitride including Al, Ru, Ta, and Hf, and Si oxynitride including Al, Ru, Ta, and Hf) that can be formed at a low temperature can be exemplified. Alternatively, examples include polymethyl methacrylate (PMMA); polyvinylphenol (PVP); polyvinyl alcohol (PVA); polyimide; polycarbonate (PC); polyethylene terephthalate (PET); polystyrene; silanol derivatives (silane coupling agents) such as N-2(aminoethyl)3-aminopropyltrimethoxysilane (AEAPTMS), 3-mercaptopropyltrimethoxysilane (MPTMS), and octadecyltrichlorosilane (OTS); novolac type phenol resin; fluorine-based resin; organic insulating materials (organic polymers) exemplified by straight-chain hydrocarbons having a functional group capable of bonding to a control electrode at one end such as octadecanethiol and dodecyl isocyanate, and combinations thereof can also be used. The various insulating layers and the various interlayer insulating layers can be formed on the basis of known methods such as various CVD methods, coating methods, various PVD methods including a sputtering method and a vacuum vapor deposition method, various printing methods such as a screen printing method, and a sol-gel method. The contact hole and the connection hole may be formed on the pad portion.

The base portion can include, for example, a silicon semiconductor substrate, or can include an SOI substrate (specifically, a silicon layer constituting an SOI substrate or the like). Examples of the SOI substrate include an SOI substrate formed on the basis of a smart cut method and a substrate bonding technique, an SOI substrate formed on the basis of separation by implantation of oxygen (SIMOX), and an SOI substrate in which an insulating layer is formed on the surface of a silicon semiconductor substrate and a silicon layer is formed on the insulating layer. Alternatively, instead of the silicon layer, the base portion can include an InGaAs layer or a Ge layer.

Examples of the semiconductor apparatus of the present disclosure or an electronic device incorporating the nonvolatile memory cell array of the semiconductor apparatus of the present disclosure include a portable electronic device such as mobile equipment, game equipment, music equipment, or video equipment, a fixed electronic device, and a magnetic head. Furthermore, a storage apparatus including the semiconductor apparatus of the present disclosure or the nonvolatile memory cell array of the semiconductor apparatus of the present disclosure can be exemplified, and the semiconductor apparatus of the present disclosure or the nonvolatile memory cell array of the semiconductor apparatus of the present disclosure can be used as one time programmable memory (OTP memory).

FIRST EXAMPLE

Figure 2:
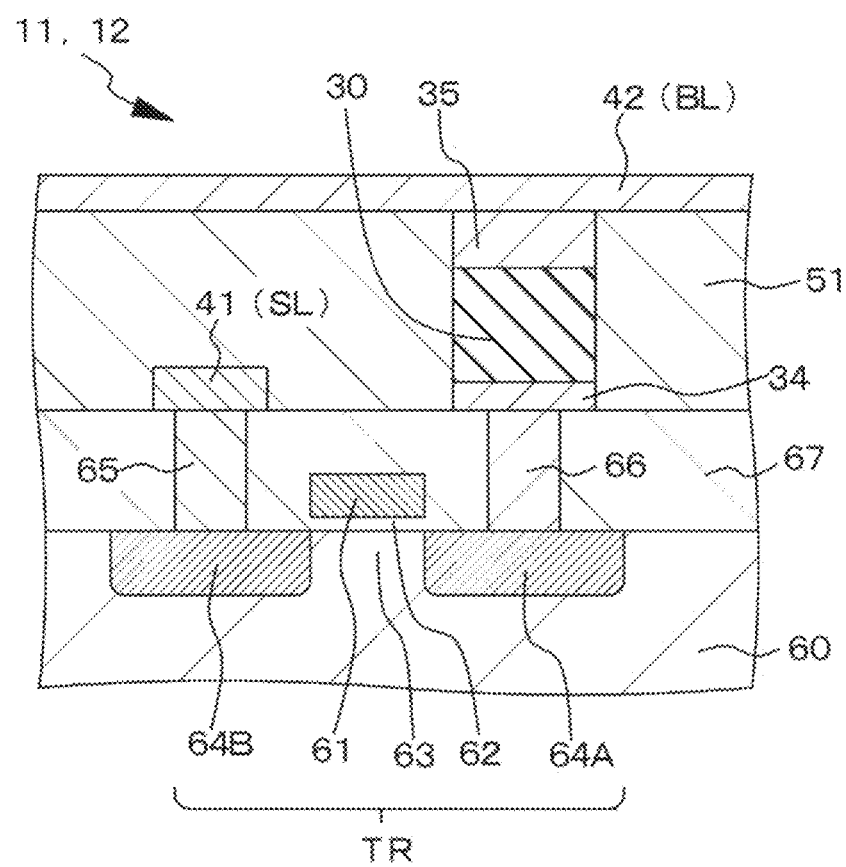
FIG. 2 is a schematic partial cross-sectional diagram of a memory cell in a nonvolatile memory cell array constituting the semiconductor apparatus of the first example.
Figure 3:
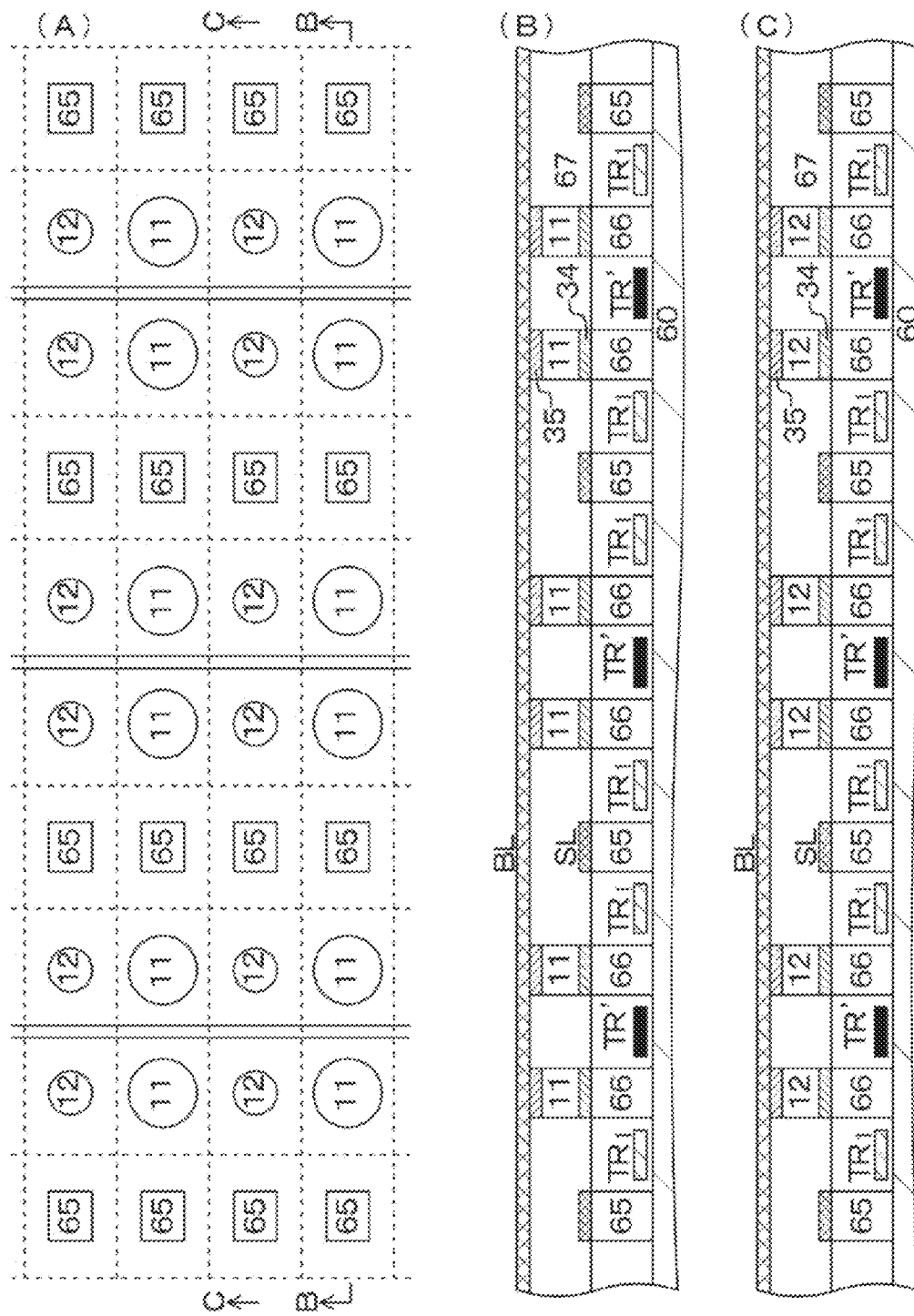
FIG. 3 is a diagram schematically illustrating a disposition state of first memory elements and second memory elements in a nonvolatile memory cell array constituting the semiconductor apparatus of the first example, and is a schematic partial cross-sectional diagram of a nonvolatile memory cell array constituting the semiconductor apparatus of the first example.
Figure 4:
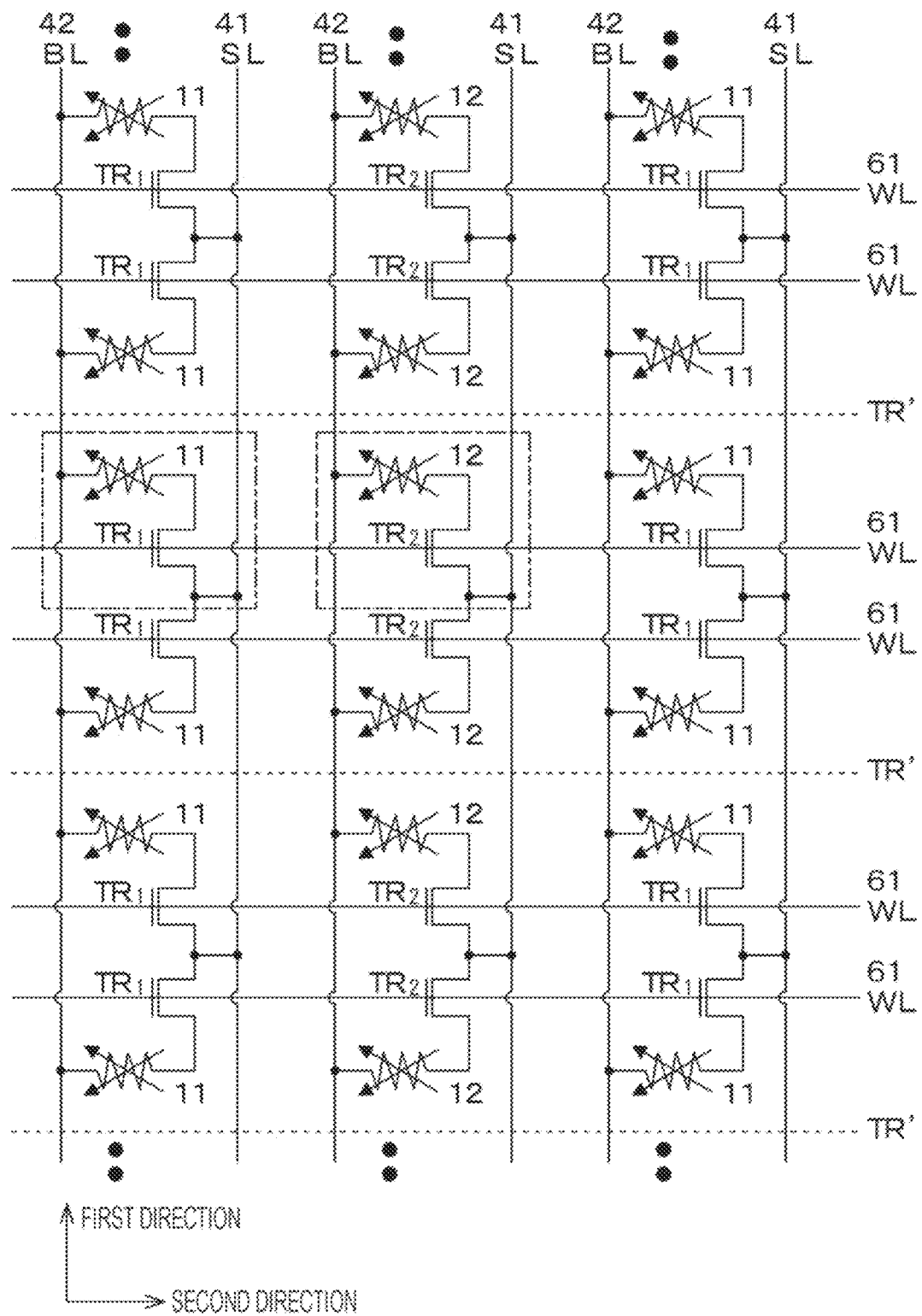
FIG. 4 is an equivalent circuit diagram of a nonvolatile memory cell array constituting the semiconductor apparatus of the first example.
Figure 5:
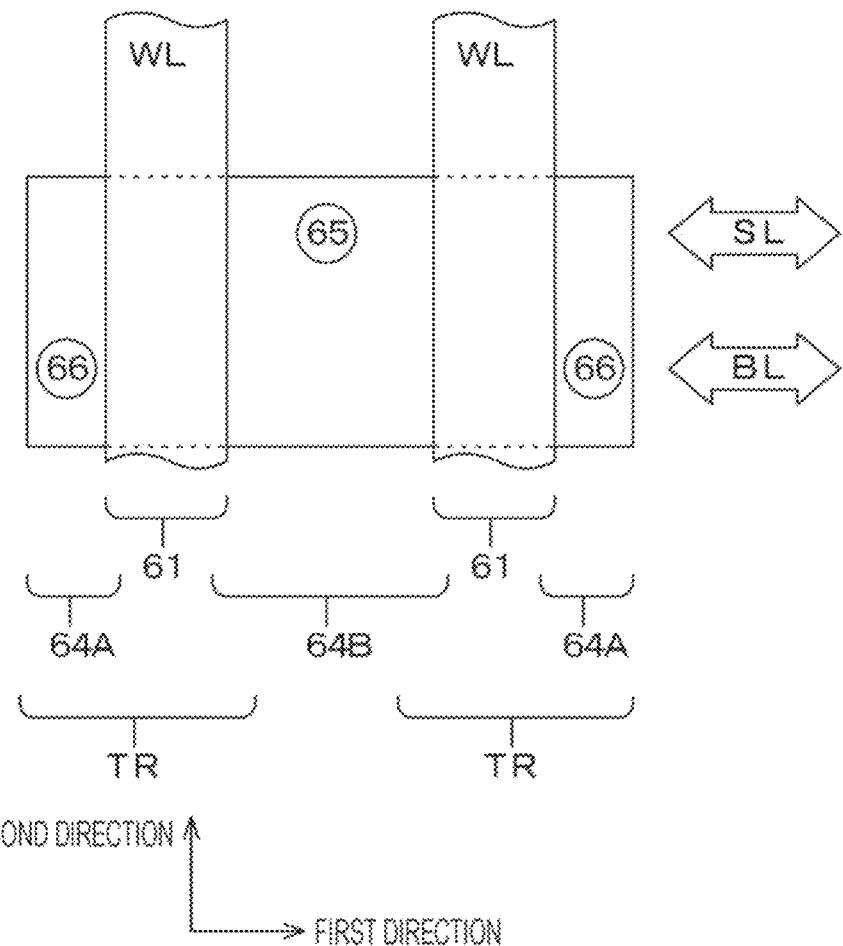
FIG. 5 is a diagram schematically illustrating a disposition state of a selection transistor and the like in a nonvolatile memory cell array constituting the semiconductor apparatus of the first example.
Figure 6A:
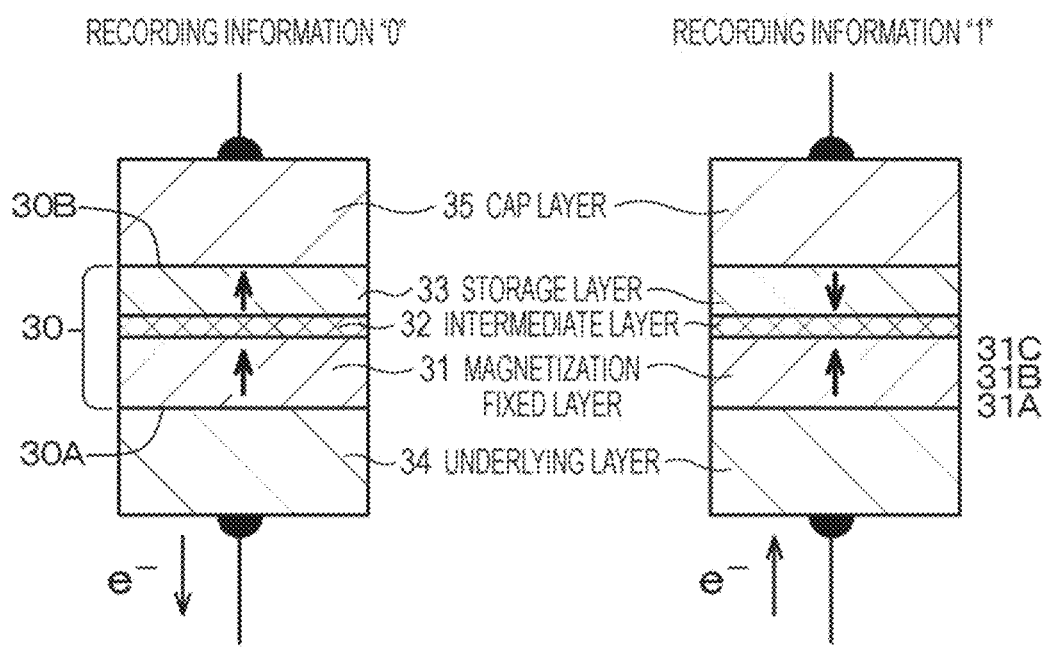
FIGS. 6A and 6B are a conceptual diagram of spin transfer torque based magnetic random access memory to which spin transfer magnetization reversal is applied and a conceptual diagram of spin transfer torque based magnetic random access memory having a double spin filter structure, respectively.
Figure 6B:
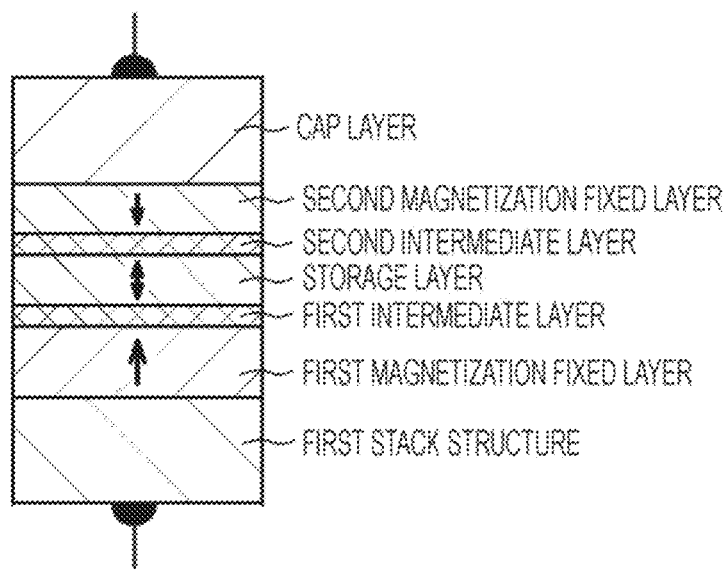

The first example relates to the semiconductor apparatus according to the first aspect of the present disclosure, specifically, the nonvolatile memory cell array of the first-A aspect, and the method for manufacturing the semiconductor apparatus of the present disclosure FIG. 1 schematically illustrates a disposition state of the first memory elements and the second memory elements in the nonvolatile memory cell array (hereinafter, sometimes simply referred to as the "nonvolatile memory cell array") constituting the semiconductor apparatus of the first example, FIG. 2 illustrates a schematic partial cross-sectional diagram of the memory cell constituting the nonvolatile memory cell array of the first example, (A) of FIG. 3 schematically illustrates a disposition state of the first memory elements and the second memory elements in the nonvolatile memory cell array of the first example, (B) and (C) of FIG. 3 illustrate schematic partial cross-sectional diagrams of the nonvolatile memory cell array of the first example, FIG. 4 illustrates an equivalent circuit diagram of the nonvolatile memory cell array of the first example, FIG. 5 schematically illustrates a disposition state of the selection transistor and the like in the nonvolatile memory cell array of the first example, FIG. 6A illustrates a conceptual diagram of the spin transfer torque based magnetic random access memory to which spin transfer magnetization reversal is applied, and FIG. 6B illustrates a conceptual diagram of the spin transfer torque based magnetic random access memory having the double spin filter structure. Note that (B) and (C) of FIG. 3 are schematic partial cross-sectional diagrams taken along arrows B-B and C-C in (A) of FIG. 3.

Figure 9:
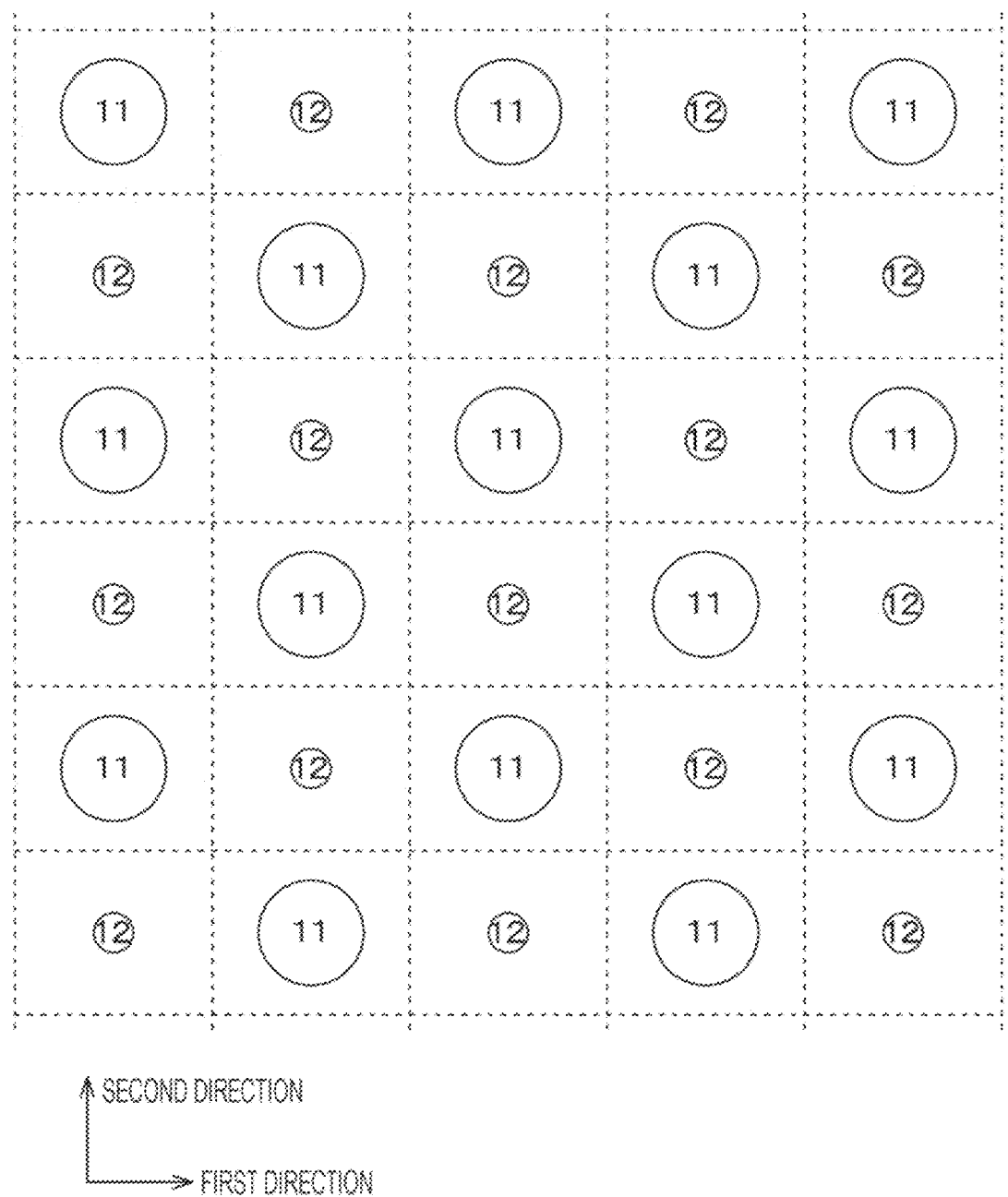
FIG. 9 is a diagram schematically illustrating a disposition state of first memory elements and second memory elements in a nonvolatile memory cell array constituting a semiconductor apparatus of a second example.

Here, in FIG. 1 and FIGS. 7 and 9 described later, one nonvolatile memory element is partitioned by the dotted line. Furthermore, in (A) of FIG. 3 and (A) of FIG. 10, (A) of FIG. 12, and (A) of FIG. 20 described later, one nonvolatile memory element is partitioned by the dotted line, and in (A) of FIG. 3 and (A) of FIG. 10 and (A) of FIG. 12 described later, the disposition position of the isolation transistor is indicated by the double line. Moreover, in FIG. 4 and FIGS. 11 and 13 described later, a pair of memory cells is partitioned by the dotted line, and one memory cell is surrounded by the one-dot chain line. Furthermore, in (B) and (C) of FIG. 3, (B) and (C) of FIG. 10, (B) and (C) of FIG. 12, and (B) and (C) of FIG. 20, hatching lines are omitted in the contact holes, the interlayer insulating layers, some of the nonvolatile memory elements, and the cap layers.

The semiconductor apparatus of the first example or the second to fifth examples described later includes:
the nonvolatile memory cell array including
a plurality of first memory cells including first memory elements 11 and 21 including resistance-variable nonvolatile memory elements and a first selection transistor $TR_1$ electrically connected to the first memory elements 11 and 21; and
a plurality of second memory cells including second memory elements 12 and 22 including resistance-variable nonvolatile memory elements and a second selection transistor $TR_2$ electrically connected to the second memory elements 12 and 22.

Then, in the semiconductor apparatus of the first example, the plurality of first memory elements 11 and the plurality of second memory elements 12 are arranged in a two-dimensional matrix in a first direction and a second direction different from the first direction and on the same interlayer insulating layer 67,
the first memory element 11 is larger than the second memory element 12, and
the first memory element 11 and the second memory element 12 are disposed adjacent to each other along the second direction. In other words, the first memory element 11 and the first memory element 11 having a large size are disposed so as not to be adjacent to each other along the second direction.

Furthermore, a first memory element group including the plurality of first memory elements 11 is arranged along the first direction, a second memory element group including the plurality of second memory elements 12 is arranged along the first direction, and the first memory element group and the second memory element group are alternately arranged along the second direction.

Then, in the nonvolatile memory cell array of the first example, the first memory cell 11 includes one first memory element 21 and one first selection transistor $TR_1$, and the second memory cell 12 includes one second memory element 22 and one second selection transistor $TR_2$. That is, the memory cell constituting the nonvolatile memory cell array of the first example is a so-called "1T-1R"-type memory cell.

The three-dimensional shape of the first memory element 11 and the second memory element 12 is a cylindrical shape (columnar shape) or a quadrangular prism, but is not limited thereto.

Then, in the nonvolatile memory cell array of the first example, when the area of the first memory element 11 is $S_1$ and the area of the second memory element 12 is $S_2$, $$1 < S_1/S_2 \leq 10$$

is satisfied, and when the formation pitch of the first memory element 11 and the second memory element 12 along the second direction is $P_{2-12}$, $$1.1 \leq P_{2-12}/R_1 \leq 10,$$

preferably, $$1.3 \leq P_{2-12}/R_1 \leq 10$$

is satisfied, and when the formation pitch of the first memory element 11 and the first memory element 11 along the first direction is $P_{1-12}$, $$2 \leq P_{1-12}/R_1 \leq 20$$

is satisfied. Specifically, when $$S_1 = \Pi(R_1/2)^2$$

$$S_2 = \Pi(R_2/2)^2,$$

$$R_1 = 60 \text{ nm}$$

$$R_2 = 40 \text{ nm}$$

$$P_{2-12} = 90 \text{ nm}$$

$$P_{1-12} = 200 \text{ nm}$$

$$S_1/S_2 = 2.25.$$

Note that, as a first comparative example, in a case where it is assumed that the first memory element and the first memory element are arranged along the second direction, the value of the formation pitch $P_{2-11}$ of the first memory element and the first memory element along the second direction is 100 nm when $R_1 = 60$ nm in order not to cause a short circuit between the first memory element and the first memory element, and increases by 11% as compared with the value of $P_{2-12}$ described above.

Here, the formation pitches $P_{2-12}$ of the first memory element 11 and the second memory element 12 along the second direction is the smallest among the formation pitches $P_{1-11}$, $P_{1-22}$, $P_{1-12}$, $P_{2-11}$, $P_{2-22}$, and $P_{2-12}$ described above.

Furthermore, the first memory element 11 and the second memory element 12 have different thermal stability.

The first memory elements 11 and 21 and the second memory elements 12 and 22 including resistance-variable nonvolatile memory elements constituting the memory cells of the first example or the second to fifth examples described later include a stack structure 30 that is formed by stacking a storage layer (also referred to as a magnetization reversal layer or a free layer) 33, an intermediate layer 32, and a magnetization fixed layer 31, and includes a first surface 30A and a second surface 30B facing the first surface 30A. Then, the magnetization fixed layer 31 is located on the first surface 30A side, and the storage layer 33 is located on the second surface 30B side. The first surface 30A of the magnetization fixed layer 31 is in contact with an underlying layer 34, and the underlying layer 34 is formed on the interlayer insulating layer 67 including $SiO_2$. A pad portion may be provided between the underlying layer 34 and the interlayer insulating layer 67.

The magnetization fixed layer 31 has a multilayered ferri-structure (also referred to as a multilayered ferri-pinned structure) in which at least two magnetic material layers are stacked. A non-magnetic layer 31B including ruthenium (Ru) is formed between one magnetic material layer (reference layer) 31C constituting the multilayered ferri-structure and another magnetic material layer (fixed layer) 31A constituting the multilayered ferri-structure.

The storage layer 33 includes a ferromagnetic material having a magnetic moment in which the magnetization direction freely changes in the stacking direction of the stack structure 30, more specifically, a Co—Fe—B alloy $[(Co_{20}Fe_{80})_{80}B_{20}]$. The intermediate layer 32 including a non-magnetic body material includes an insulating layer functioning as a tunnel barrier layer (tunnel insulating film), specifically, a magnesium oxide (MgO) layer. When the intermediate layer 32 includes the MgO layer, the magnetoresistance change rate (MR ratio) can be increased, and thus the efficiency of spin transfer can be improved, and the magnetization reversal current density required for reversing the magnetization direction of the storage layer 33 can be reduced. Moreover, a cap layer 35 is formed in contact with the second surface 30B of the stack structure 30.

Moreover, in the nonvolatile memory element array of the first example, the magnetization direction of the storage layer 33 changes according to information to be stored. Then, in the storage layer 33, the easy magnetization axis is parallel to the stacking direction of the stack structure 30 (that is, perpendicular magnetization type). That is, the nonvolatile memory element in the nonvolatile memory element array of the first example includes perpendicular magnetization-type spin transfer torque based magnetic random access memory. In other words, the nonvolatile memory element of the first example includes an MTJ element. The magnetization direction of the reference layer 31C is the magnetization direction serving as a reference of information to be stored in the storage layer 33, and information "0" and information "1" are specified by a relative angle between the magnetization direction of the storage layer 33 and the magnetization direction of the reference layer 31C.

Moreover, in the nonvolatile memory cell array of the first example or the second to fifth examples described later, the memory cell and the memory cell adjacent along the first direction are isolated by an isolation transistor TR' having the same structure as the selection transistor. The current can be prevented from flowing between the memory cell and the memory cell (specifically, between selection transistor TR and selection transistor TR) by the operation of the isolation transistor TR'. The isolation transistor TR' preferably has the same structure as the selection transistor TR. The memory cell and the memory cell adjacent along the second direction are isolated by, for example, an isolation region having a shallow trench structure. Note that, in FIGS. 4, 11, 13, 21, and 22, the positions where the isolation transistors are arranged are indicated by the dotted lines.

The underlying layer 34 is connected to a contact hole 66. Specifically, the underlying layer 34 is formed on the contact hole 66. Furthermore, the cap layer 35 is connected to a bit line BL (second wiring 42). Then, when a current (magnetization reversal current) flows between a sense line SL (first wiring 41) and the bit line BL (second wiring 42), information is stored in the storage layer 33. That is, when the magnetization reversal current is caused to flow in the stacking direction of the stack structure 30, the magnetization direction of the storage layer 33 is changed, and information is recorded in the storage layer 33. As described above, the easy magnetization axis of the reference layer 31C is parallel to the stacking direction of the stack structure 30. That is, the reference layer 31C includes a ferromagnetic material having a magnetic moment in which the magnetization direction changes in a direction parallel to the stacking direction of the stack structure 30, more specifically, a Co—Fe—B alloy $[(Co_{20}Fe_{80})_{80}B_{20}]$. Moreover, a fixed layer 31A includes a Co—Pt alloy layer, and constitutes a multilayered ferri-structure magnetically coupled to the reference layer 31C via the non-magnetic layer 31B including ruthenium (Ru).

Various layer configurations in the first example or the second to fifth examples described later are indicated in Table 1 below.

TABLE 1

| | |
|---|---|
| Cap layer 35: | Stack of Ta layer having film thickness of 1 nm and Ru layer having film thickness of 5 nm |
| Stack structure 30 | |
| Storage layer 33: | $(CO_{20}Fe_{80})_{80}B_{20}$ layer having film thickness of 1.6 nm |
| Intermediate layer 32 : | MgO layer having film thickness of 1.0 nm |
| Magnetization fixed layer 31 | |
| Reference layer 31C: | $(CO_{20}Fe_{80})_{80}B_{20}$ layer having film thickness of 1.0 nm |
| Non-magnetic layer 31B: | Ru layer having film thickness of 0.8 nm |
| Fixed layer 31A: | Co—Pt alloy layer having film thickness of 2.5 nm |
| Underlying layer 34: | Ta layer having film thickness of 5 nm |

As FIG. 2 illustrates a schematic partial cross-sectional diagram of the memory cell of the first example including the selection transistor, and FIG. 5 schematically illustrates a disposition state of the selection transistor and the like, the selection transistor TR ($TR_1$, $TR_2$) including a field effect transistor is provided below the stack structure 30.

Specifically,
  the selection transistor TR ($TR_1$, $TR_2$) formed on a semiconductor substrate 60, and
  the interlayer insulating layer 67 covering the selection transistor TR
are provided,
  the first wiring 41 (sense line SL) is formed on the interlayer insulating layer 67,
  first wiring 41 is electrically connected to another source/drain region 64B of the selection transistor TR via a connection hole 65 (or the connection hole and a landing pad portion, alternatively a lower layer wiring in some cases) provided in the first interlayer insulating layer 67,
  the underlying layer 34, the stack structure 30, and the cap layer 35, and an insulating material layer 51 surrounding the underlying layer 34, the stack structure 30, and the cap layer 35 are formed on the interlayer insulating layer 67,
  the stack structure 30 is electrically connected to one source/drain region 64A of the selection transistor via the contact hole 66 provided in the interlayer insulating layer 67 via the underlying layer 34, and
  the bit line BL (second wiring 42) in contact with the stack structure 30 via the cap layer 35 is formed on the insulating material layer 51.

The selection transistor TR ($TR_1$, $TR_2$) includes a gate electrode 61, a gate insulating layer 62, a channel formation region 63, and the source/drain regions 64A and 64B. As described above, the other source/drain region 64B and the sense line SL (first wiring 41) are connected to the sense line SL (first wiring 41) formed on the interlayer insulating layer 67 via the connection hole 65 including a tungsten plug. Furthermore, the one source/drain region 64A is connected to the stack structure 30 via the contact hole 66 and the underlying layer 34. The gate electrode 61 also functions as a so-called word line WL or an address line. Then, on the projection image in the direction in which the second wiring 42 (bit line BL) extends is orthogonal to the projection image in the direction in which the gate electrode 61 (word line WL) extends, and is parallel to the projection image in the direction in which the sense line SL (first wiring 41) extends. However, in FIG. 2, in order to simplify the drawing, the extending directions of the gate electrode 61, the first wiring 41, and the second wiring 42 are different from these. Furthermore, in FIG. 5, the second wiring 42 (bit line BL) and the first wiring 41 (sense line SL) extend in the second direction above the sheet of paper of FIG. 5, the word line WL extends in the second direction in the sheet of paper of FIG. 5, and the extension portion of the gate electrode of the isolation transistor TR' also extends in the second direction. By applying an appropriate voltage to the gate electrode of the isolation transistor TR', the isolation transistor TR' is always in a non-conductive state.

Hereinafter, a method for manufacturing the nonvolatile memory cell array of the first example will be described.

[Step-100]

First, the first selection transistor and the second selection transistor constituting the first memory cell and the second memory cell are formed on the base portion, and then the interlayer insulating layer is formed on the entire surface. Specifically, the selection transistor TR (the first selection transistor $TR_1$ and the second selection transistor $TR_2$) including the gate insulating layer 62, the gate electrode 61, and the source/drain regions 64A and 64B is formed on the silicon semiconductor substrate 60 corresponding to the base portion on the basis of a known method. A portion of the silicon semiconductor substrate 60 located between the source/drain region 64A and the source/drain region 64B corresponds to the channel formation region 63. Furthermore, the isolation transistor TR' having the same structure as the selection transistor TR is formed between the memory cell and the memory cell. Next, the interlayer insulating layer 67 is formed on the entire surface, the connection hole 65 is formed in a portion of the interlayer insulating layer 67 above the other source/drain region 64B, and moreover, the sense line SL (first wiring 41) is formed on the interlayer insulating layer 67. Furthermore, the contact hole 66 is formed in a portion of the interlayer insulating layer 67 above the one source/drain region 64A. If necessary, a pad portion in contact with the contact hole 66 may be provided on the interlayer insulating layer 67.

[Step-110]

Thereafter, a stack film for forming a nonvolatile memory element electrically connected to the first selection transistor $TR_1$ and the second selection transistor $TR_2$ constituting the first memory cell and the second memory cell is formed on the interlayer insulating layer 67, and then the stack film is patterned (specifically, etched) to form the first memory element 11 and the second memory element 12. Specifically, the underlying layer 34, the stack structure 30, and the cap layer 35 are continuously formed on the entire surface of the interlayer insulating layer 67, and then the cap layer 35, the stack structure 30, and the underlying layer 34 are patterned on the basis of a reactive ion etching method (RIE method) or an ion milling method (ion beam etching method). The underlying layer 34 is in contact with the contact hole 66. The intermediate layer 32 including magnesium oxide (MgO) was formed by forming a MgO layer on the basis of an RF magnetron sputtering method. Furthermore, the other layers were formed by a DC magnetron sputtering method.

[Step-120]

Next, the insulating material layer 51 is formed on the entire surface, and planarization processing is performed on the insulating material layer 51, so that the top surface of the insulating material layer 51 is at the same level as the top surface of the cap layer 35. Thereafter, the bit line BL (second wiring 42) in contact with the cap layer 35 is formed on the insulating material layer 51. In this way, the memory cell (specifically, spin transfer torque based magnetic random access memory) having the structure illustrated in FIG. 2 can be obtained.

As described above, a general MOS manufacturing process can be applied to manufacturing of the memory cell of the first example, and the memory cell can be applied as general-purpose memory.

In the case of a resistance-variable nonvolatile memory element that stores binary information, the nonvolatile memory element is a type of so-called variable resistance element that takes two states: a high resistance state (HRS) and a low resistance state (LRS), and the states are associated with, for example, "1" and "0". Then, in general, the 0/1 state of the resistance-variable nonvolatile memory element is determined based on whether its resistance value is higher or lower than a comparison reference resistance value, which is also called a reference resistance value, and a sense amplifier for performing this comparison determination is provided. The reference resistance value is often combined on the basis of a plurality of memory elements in which the HRS or the LRS is written in advance (these are referred to as "reference elements"). That is, it is generated as an average value of the resistance value in the HRS and the resistance value in the LRS. In the nonvolatile memory cell array of the first example or the second to fourth examples described later, at the time of reading data, a voltage appearing in the sense line SL is compared with a reference voltage, and it is determined whether data "1" is stored or "0" is stored depending on the level of the voltage.

Meanwhile, the information is specified by the orientation of the magnetization direction of the storage layer 33 having uniaxial anisotropy. The information is written by causing the magnetization reversal current (spin polarization current) to flow in the stacking direction of the stack structure 30 to cause spin torque magnetization reversal. Hereinafter, the spin torque magnetization reversal will be briefly described with reference to FIG. 6A, which is a conceptual diagram of the spin transfer torque based magnetic random access memory to which the spin transfer magnetization reversal is applied. Electrons have two types of spin angular momenta. It is assumed that they are defined as upward and downward. The number of both is the same in a non-magnetic body, and the number of both is different in a ferromagnetic body.

It is assumed that orientations of magnetic moments of the storage layer 33 and the reference layer 31C including a ferromagnetic material are in an antiparallel state. In this state, information "1" is stored in the storage layer 33. It is assumed that the information "1" stored in the storage layer 33 is rewritten to "0". In this case, the magnetization reversal current (spin polarization current) flows from the storage layer 33 to the magnetization fixed layer 31 in the state illustrated in the right-hand conceptual diagram of FIG. 6A. That is, electrons flow from the magnetization fixed layer 31 toward the storage layer 33. The electrons having passed through the reference layer 31C are spin-polarized, that is, there is a difference in the number between upward and downward. When the thickness of the intermediate layer 32 is sufficiently thin and the storage layer 33 is reached before the spin polarization is relaxed to be in a non-polarized state (state in which the numbers of upward and downward are the same) in a normal non-magnetic body, because the signs of the spin polarization degrees are reversed, some electrons are reversed, that is, the orientation of the spin angular momentum is changed in order to lower the energy of the entire system. At this time, since the total angular momentum of the system needs to be stored, a reaction equivalent to the sum of angular momentum changes due to the electrons having the changed orientation is applied to the magnetic moment in the storage layer 33. In a case where the current, that is, the number of electrons passing through the stack structure 30 in a unit time is small, the total number of electrons whose orientation is changed is also small, and thus, the angular momentum change generated in the magnetic moment in the storage layer 33 is also small, but when the current increases, a large angular momentum change can be given to the storage layer 33 in a unit time. A temporal change in the angular momentum is torque, and when the torque exceeds a certain threshold value, the magnetic moment of the storage layer 33 starts to be reversed, and becomes stable when rotated 180 degrees due to its uniaxial anisotropy. That is, reversal from the antiparallel state to the parallel state occurs, and information "0" is stored in the storage layer 33 (see the left-hand conceptual diagram of FIG. 6A).

Next, it is assumed that the information "0" stored in the storage layer 33 is rewritten to "1". In this case, the magnetization reversal current reversely flows from the magnetization fixed layer 31 to the storage layer 33 in the state illustrated in the left-hand conceptual diagram of FIG. 6A. That is, electrons flow from the storage layer 33 toward the magnetization fixed layer 31. The electrons having the downward spin reaching the reference layer 31C pass through the magnetization fixed layer 31. On the other hand, electrons having the upward spin are reflected by the reference layer 31C. Then, when such electrons enter the storage layer 33, a torque is applied to the storage layer 33, and the storage layer 33 is reversed to an antiparallel state (see the right-hand conceptual diagram of FIG. 6A). However, at this time, the amount of current required to cause reversal is larger than that in the case of reversing from the antiparallel state to the parallel state. Although it is difficult to intuitively understand the reversal from the parallel state to the antiparallel state, it may be considered that the reversal cannot be performed because the magnetization direction of the reference layer 31C is fixed, and the storage layer 33 is reversed in order to store the angular momentum of the entire system. As described above, the information of 0/1 is stored by causing the magnetization reversal current (spin polarization current) equal to or larger than a certain threshold value corresponding to each polarity to flow in the direction from the magnetization fixed layer 31 to the storage layer 33 or in the opposite direction.

In the nonvolatile memory cell array of the first example, the first memory element having a large size has excellent thermal stability and can store and hold data for a long period of time. On the other hand, in the second memory element having a small size, because the time during which the magnetization reversal current flows can be shortened, data can be written at a higher speed than in the first memory element, and data can be written at a low current. Then, because the plurality of first memory elements and the plurality of second memory elements are arranged in a two-dimensional matrix in the first direction and the second direction different from the first direction and on the same interlayer insulating layer, and the first memory element and the second memory element are disposed adjacent to each other along the second direction, even when the interval (formation pitch) between the first memory element and the second memory element is narrowed along the second direction, as compared with a case where the first memory element and the first memory element are arranged along the second direction, there is no possibility that a short circuit occurs between adjacent nonvolatile memory elements due to redeposition of residues of the stack film at the time of patterning, and there is no possibility that a constituent element of the nonvolatile memory cell array located below the stack film to be patterned, for example, the wiring or the selection transistor is damaged. Further, since the first memory element and the second memory element can be provided by single processing, the manufacturing cost of the nonvolatile memory element array can be reduced.

Figure 7:
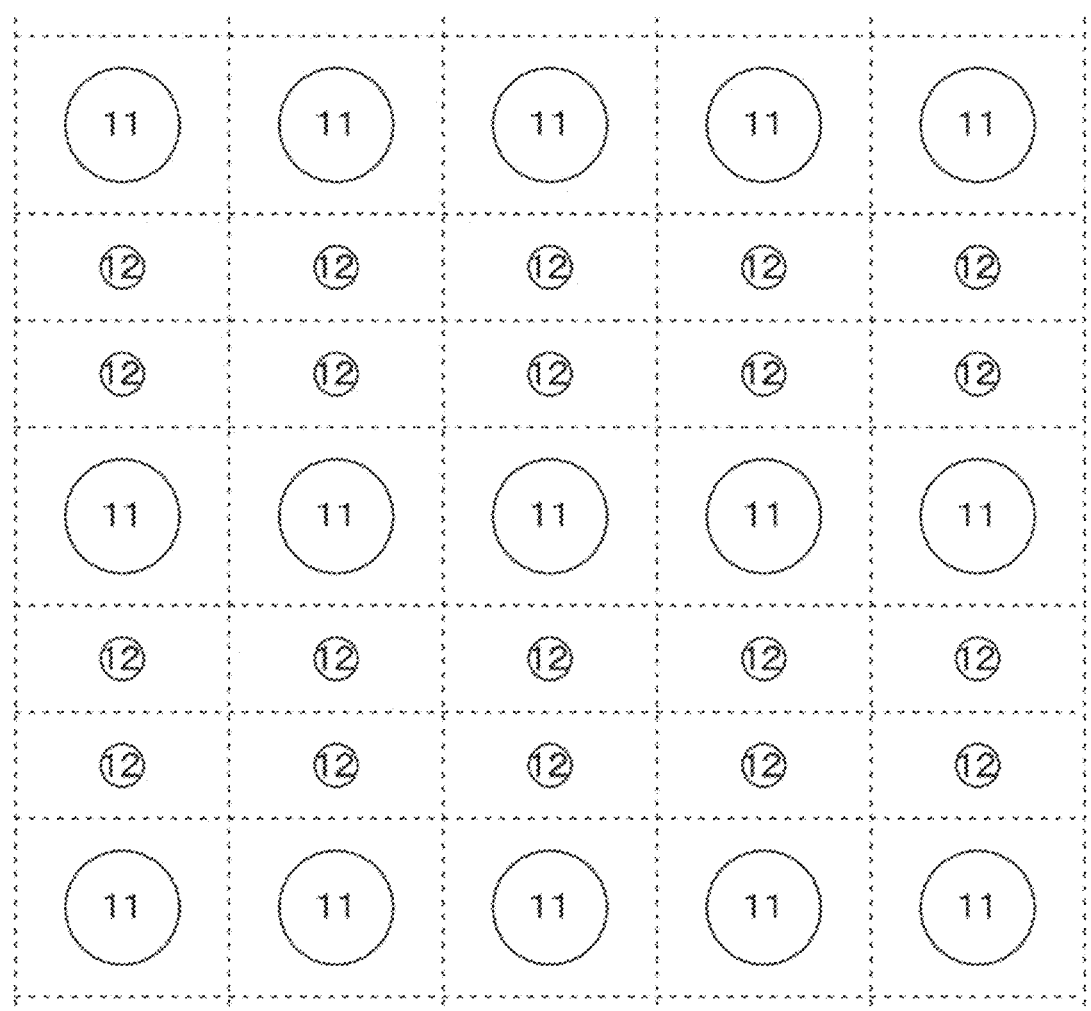
FIG. 7 is a diagram schematically illustrating a disposition state of first memory elements and second memory elements in Modification-1 of a nonvolatile memory cell array constituting the semiconductor apparatus of the first example.

In the nonvolatile memory cell array of the first example, the first memory element 11 and the second memory element 12 are disposed adjacent to each other along the second direction, but, as schematically illustrated in FIG. 7 illustrating a disposition state of the first memory element and the second memory element of Modification-1 of the nonvolatile memory cell array of the first example, N (where N≥2) second memory elements 12 may be provided between the first memory element 11 and the first memory element 11 along the second direction. That is, the number of second memory elements 12 may be larger than the number of first memory elements 11. However, the formation pitch $P_{2\text{-}22}$ of the second memory element 12 and the second memory element 12 arranged along the second direction needs to be an appropriate formation pitch.

Figure 8A:
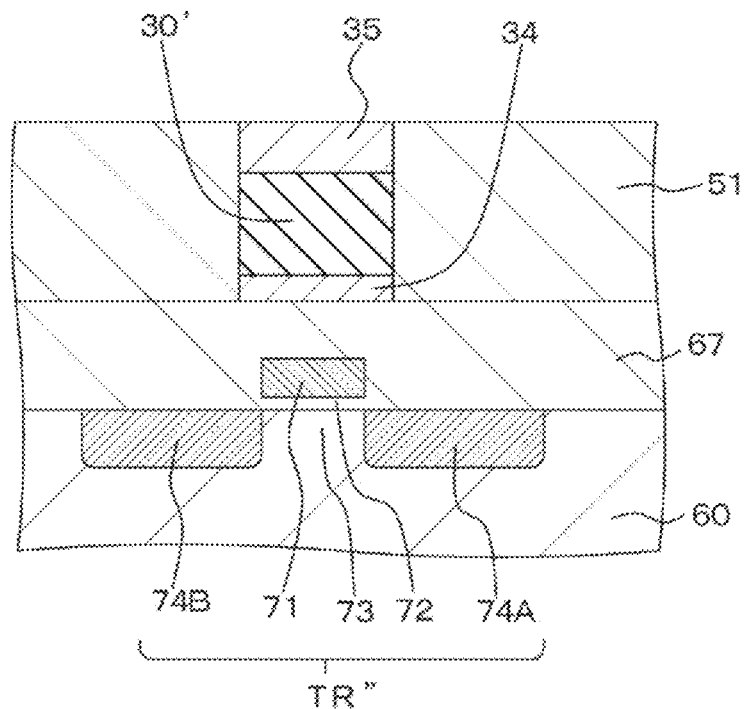
FIGS. 8A and 8B are schematic partial cross-sectional diagrams of a peripheral circuit constituting the semiconductor apparatus of the first example.
Figure 8B:
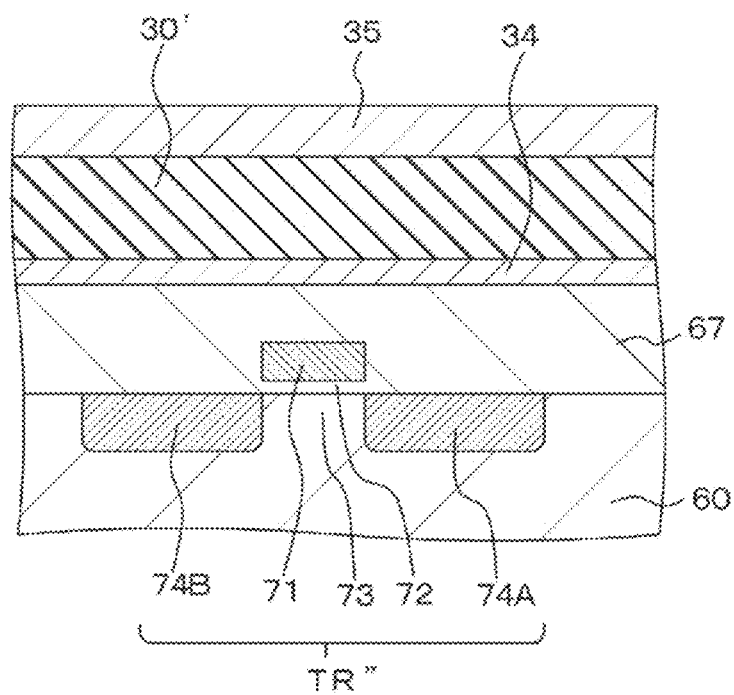

FIGS. 8A and 8B illustrate schematic partial cross-sectional diagrams of a peripheral circuit of the modification of the semiconductor apparatus of the first example. This modification of the semiconductor apparatus further includes a peripheral circuit, and a dummy stack structure 30' having the same configuration as the stack structure 30 constituting the first memory element 11 and the second memory element 12 is formed above the peripheral circuit. The peripheral circuit includes, for example, a sense amplifier and a driver for driving the selection transistor, and includes a transistor TR". The transistor TR" includes a gate electrode 71, a gate insulating layer 72, a channel formation region 73, and source/drain regions 74A and 74B. Then, as illustrated in FIG. 8A, the dummy stack structure 30' is formed above the gate electrode 71 of the transistor TR" constituting the peripheral circuit. The dummy stack structure 30' has the same configuration and structure as the stack structure 30, and is formed on the interlayer insulating layer 67. The dummy stack structure 30' can be formed simultaneously with the formation of the stack structure 30. An orthographic projection image of the gate electrode 71 of the transistor TR" constituting the peripheral circuit is included in an orthographic projection image of the dummy stack structure 30' on the base portion (silicon semiconductor substrate 60). Alternatively, as illustrated in FIG. 8B, the dummy stack structure 30' may be formed on the interlayer insulating layer 67 so as to widely cover the transistor TR" constituting the peripheral circuit. Although not illustrated, the dummy stack structure 30' may be formed above the wiring constituting the peripheral circuit. Note that, in the illustrated example, the underlying layer 34 is formed on the lower side of the dummy stack structure 30', and the cap layer 35 is formed on the upper side, but the underlying layer 34 and the cap layer 35 are essentially unnecessary.

SECOND EXAMPLE

Figure 10:
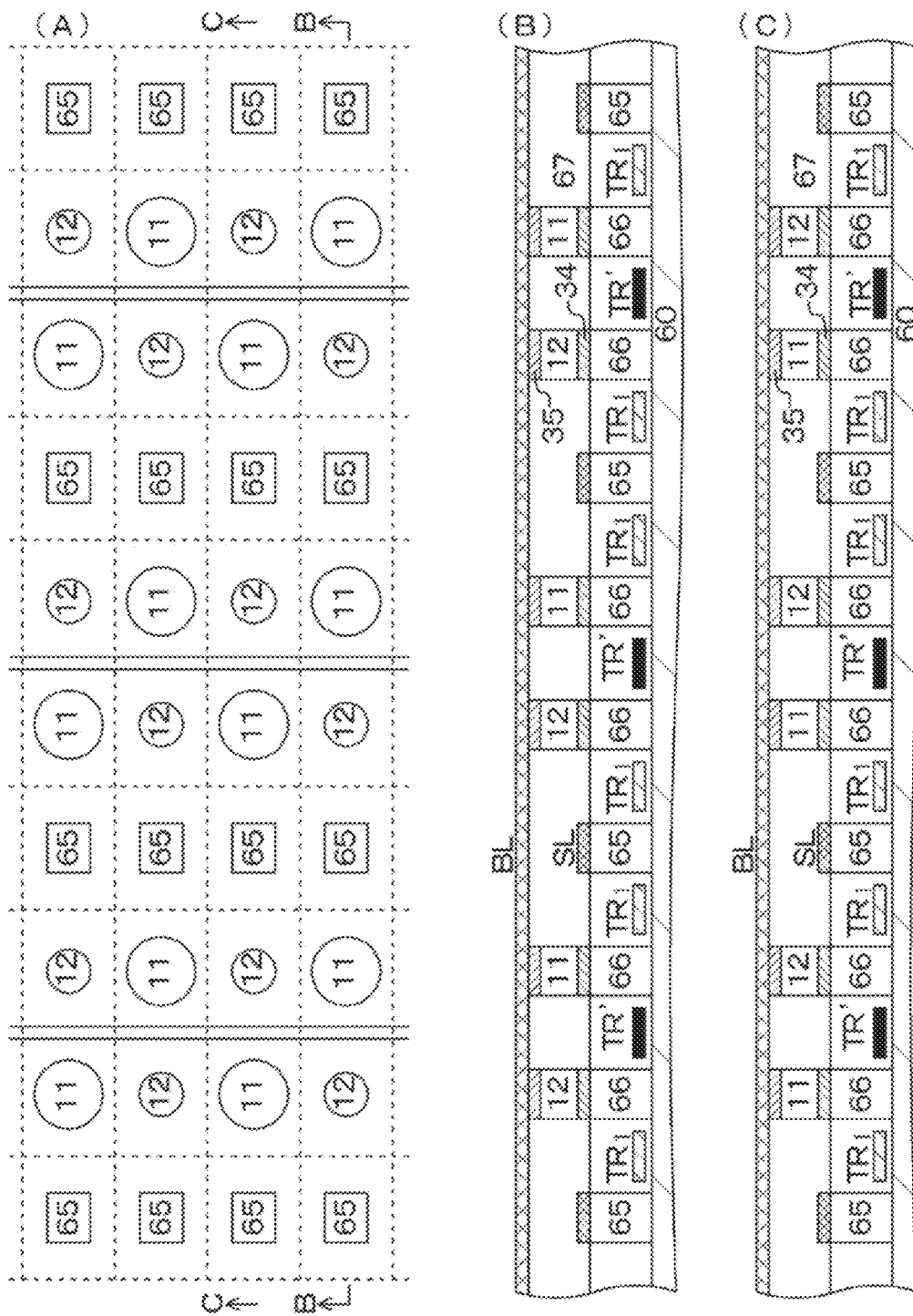
FIG. 10 is a diagram schematically illustrating a disposition state of first memory elements and second memory elements in a nonvolatile memory cell array constituting the semiconductor apparatus of the second example, and is a schematic partial cross-sectional diagram of the nonvolatile memory cell array constituting the semiconductor apparatus of the second example.
Figure 11:
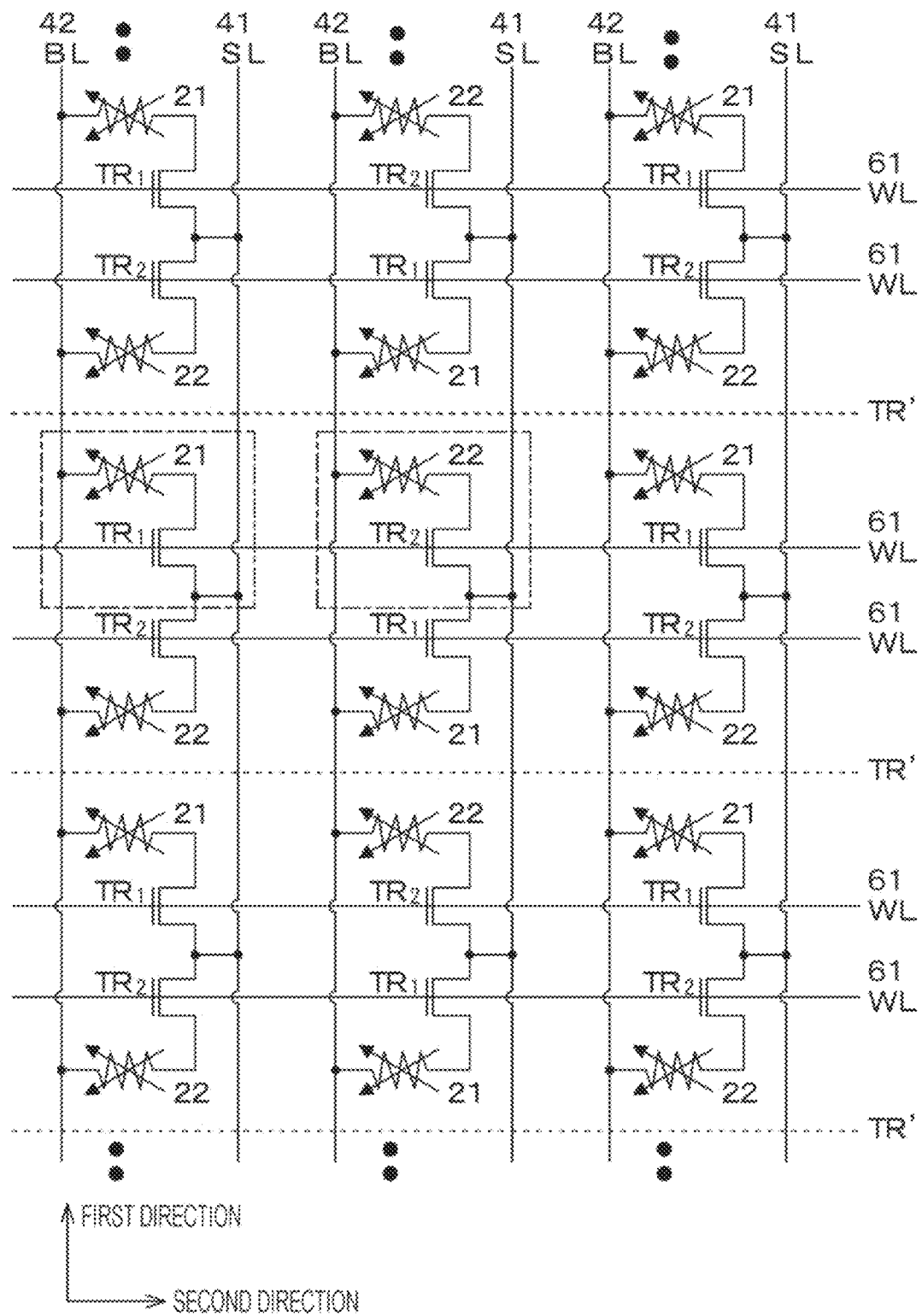
FIG. 11 is an equivalent circuit diagram of a nonvolatile memory cell array constituting the semiconductor apparatus of the second example.

The second example is a modification of the first example and relates to the nonvolatile memory cell array of the first-B aspect. FIG. 9 schematically illustrates a disposition state of first memory elements and second memory elements in a nonvolatile memory cell array of the second example, (A) of FIG. 10 schematically illustrates a disposition state of the first memory elements and the second memory elements in the nonvolatile memory cell array of the second example, (B) and (C) of FIG. 10 illustrate schematic partial cross-sectional diagrams of the nonvolatile memory cell array of the second example, and FIG. 11 illustrates an equivalent circuit diagram of the nonvolatile memory cell array of the second example. Note that (B) and (C) of FIG. 10 are schematic partial cross-sectional diagrams taken along arrows B-B and C-C in (A) of FIG. 10.

In the nonvolatile memory cell array of the second example, the first memory elements 11 and the second memory elements 12 are not only alternately arranged along the second direction but also alternately arranged along the first direction. Then, when the area of the first memory element 11 is $S_1$ and the area of the second memory element 12 is $S_2$, $$1 \leq S_1/S_2 \leq 10$$

is satisfied, and when the formation pitch of the first memory element 11 and the second memory element 12 along the first direction is $P_{1\text{-}12}'$, and the formation pitch of the first memory element 11 and the second memory element 12 along the second direction is $P_{2\text{-}12}'$, $$2 \leq P_{1\text{-}12}'/R_1 \leq 20$$

$$1 \leq P_{2\text{-}12}'/R_1 \leq 10$$

are satisfied. Specifically, in the second example, $$R_1 = 60 \text{ nm}$$

$$R_2 = 40 \text{ nm}$$

$$P_{2\text{-}12}' = 90 \text{ nm}$$

$$P_{1\text{-}12}' = 90 \text{ nm}$$

$$S_1/S_2 = 2.25.$$

Except for the above points, the configuration and structure of the nonvolatile memory cell array of the second example can be similar to the configuration and structure of the nonvolatile memory cell array of the first example, and thus the detailed description will be omitted.

THIRD EXAMPLE

Figure 12:
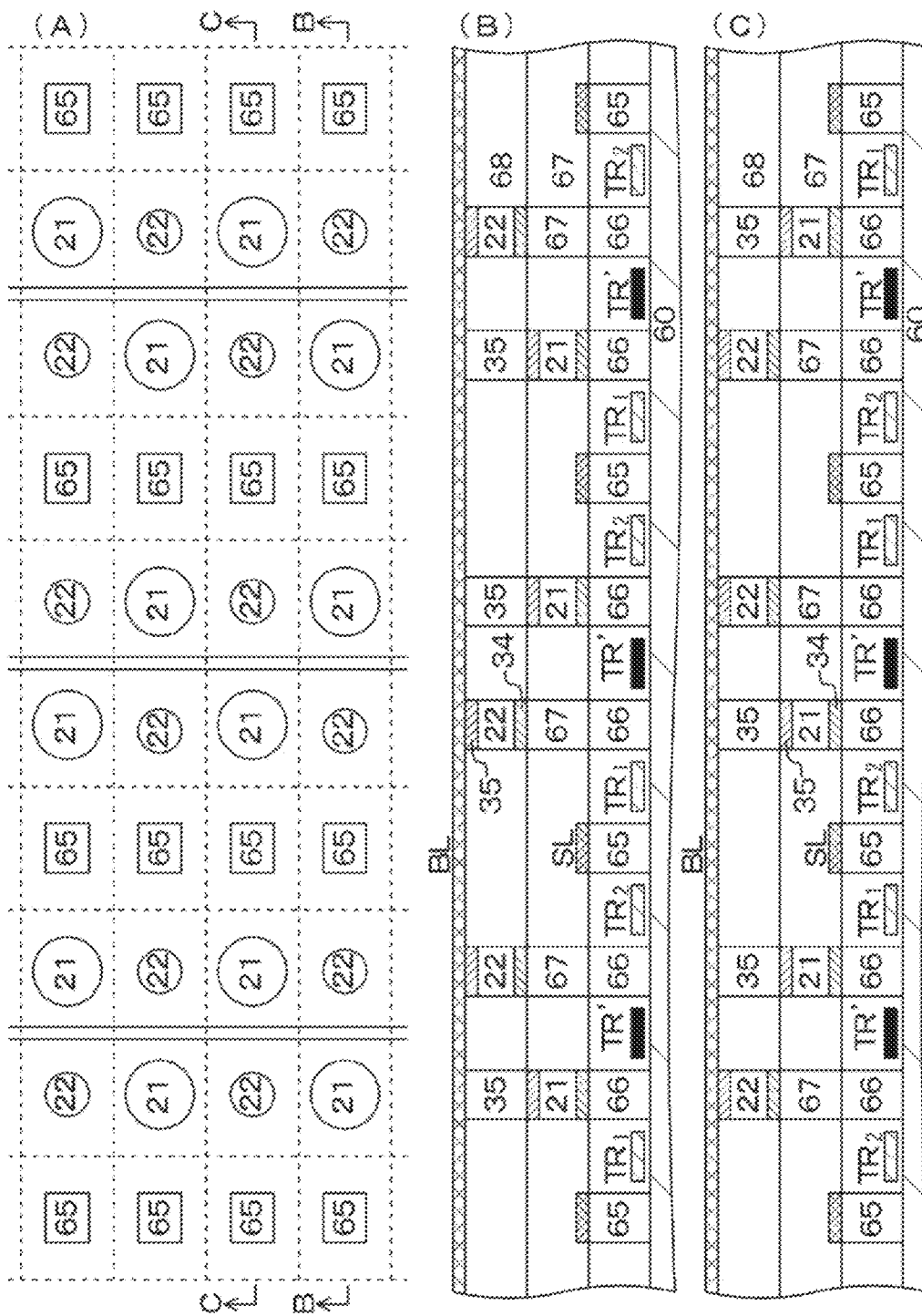
FIG. 12 is a diagram schematically illustrating a disposition state of first memory elements and second memory elements in a nonvolatile memory cell array constituting a semiconductor apparatus of a third example, and is a schematic partial cross-sectional diagram of the nonvolatile memory cell array constituting the semiconductor apparatus of the third example.
Figure 13:
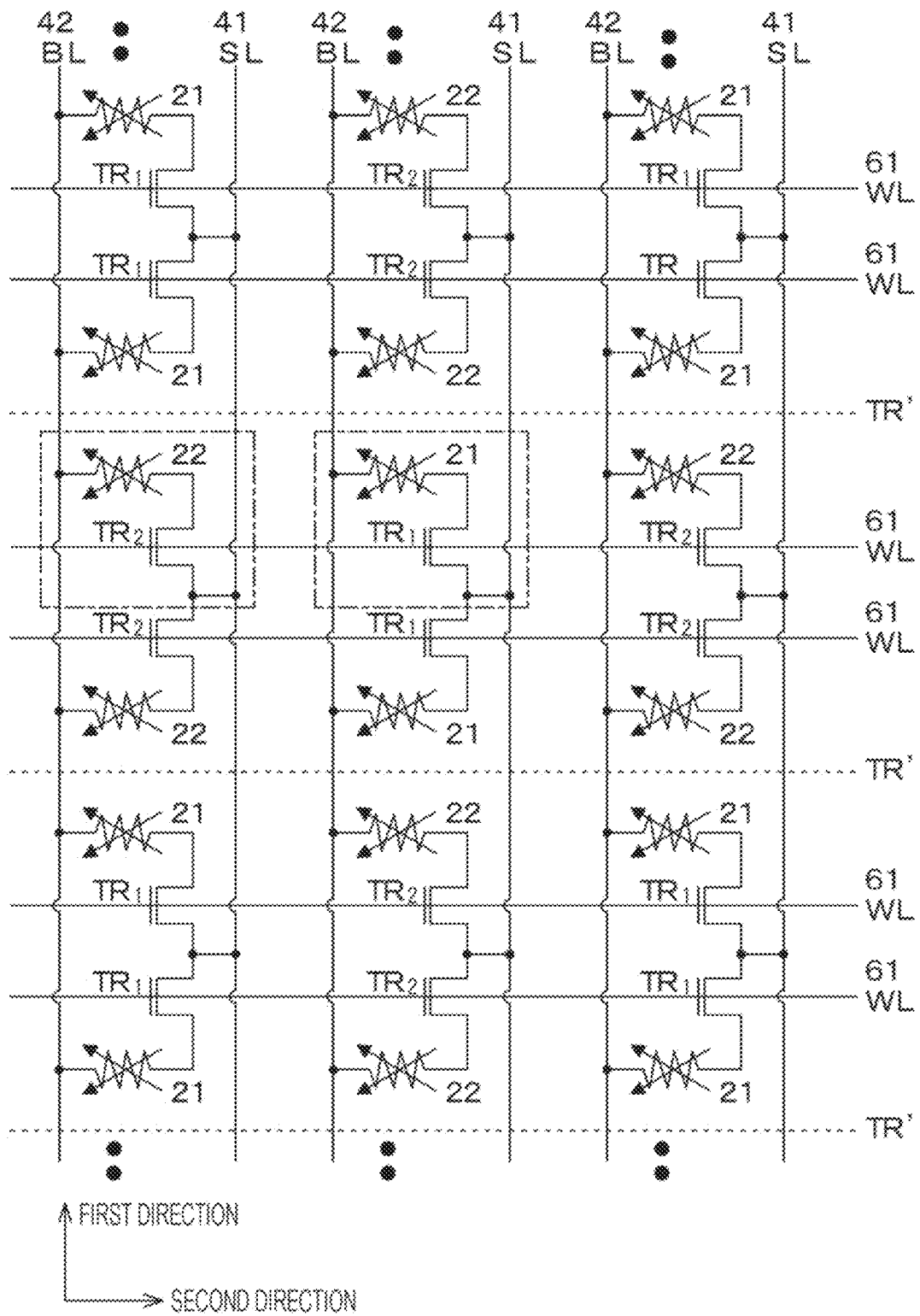
FIG. 13 is an equivalent circuit diagram of a nonvolatile memory cell array constituting the semiconductor apparatus of the third example.
Figure 14:
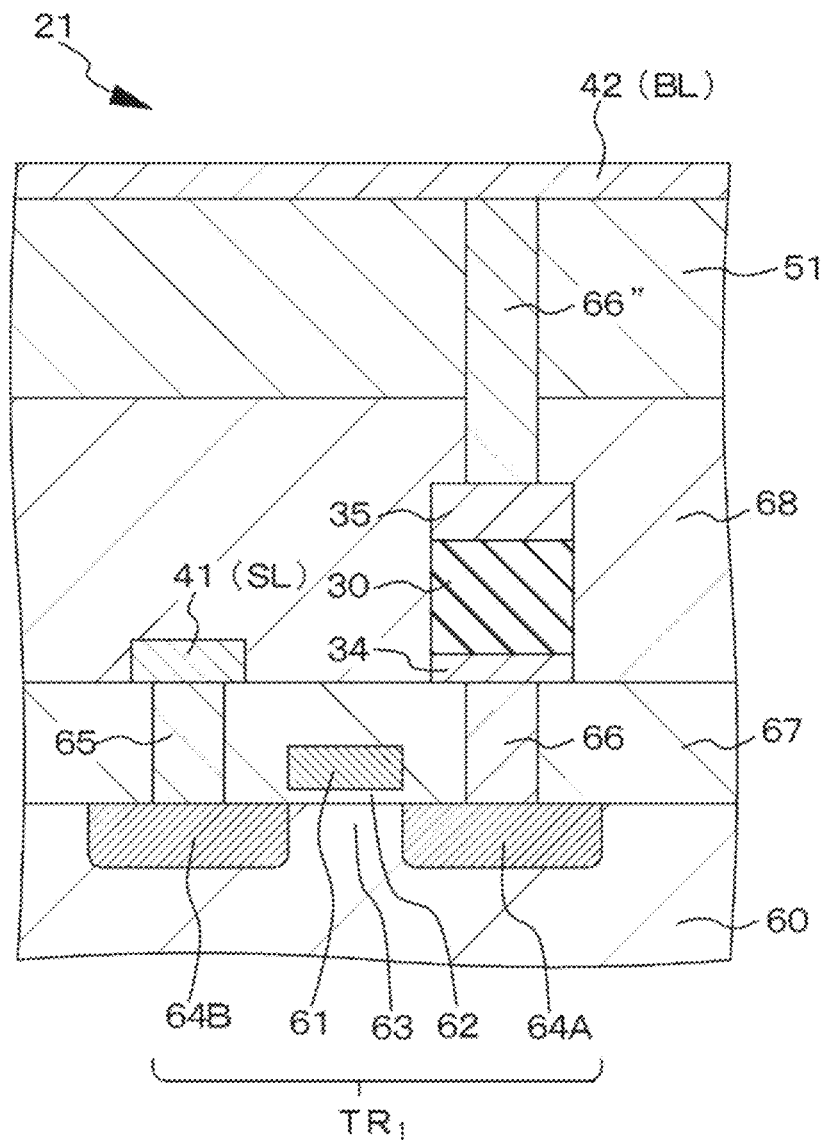
FIG. 14 is a schematic partial cross-sectional diagram of a first memory element including a selection transistor in a nonvolatile memory cell array constituting the semiconductor apparatus of the third example.
Figure 15:
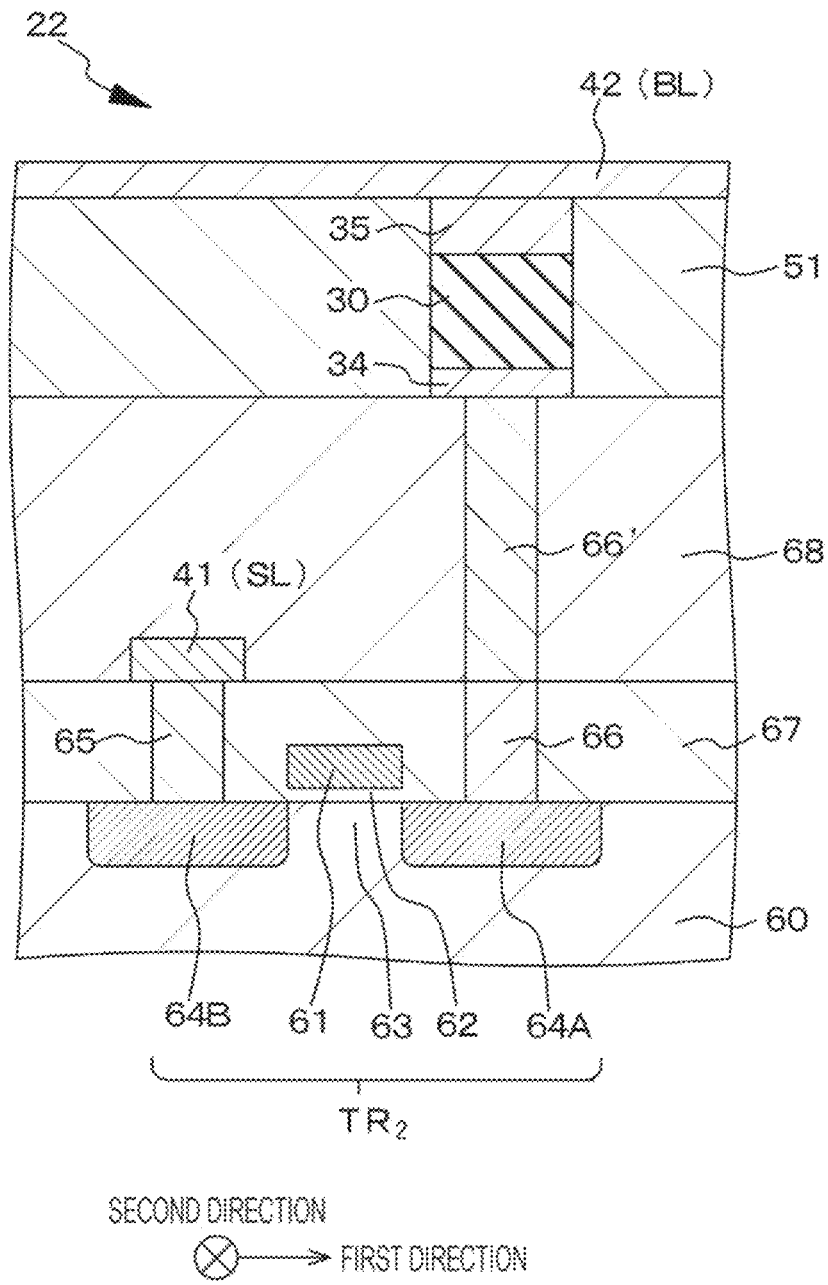
FIG. 15 is a schematic partial cross-sectional diagram of a second memory element including a selection transistor in a nonvolatile memory cell array constituting the semiconductor apparatus of the third example.

The third example relates to a nonvolatile memory cell array constituting the semiconductor apparatus according to the second aspect of the present disclosure. (A) of FIG. 12 schematically illustrates a disposition state of first memory elements and second memory elements in a nonvolatile memory cell array of the third example, (B) and (C) of FIG. 12 illustrate schematic partial cross-sectional diagrams of the nonvolatile memory cell array of the third example, and FIG. 13 illustrates an equivalent circuit diagram of the nonvolatile memory cell array of the third example. Furthermore, FIG. 14 illustrates a schematic partial cross-sectional diagram of the first memory element of the third example including a selection transistor, and FIG. 15 illustrates a schematic partial cross-sectional diagram of the second memory element. Note that (B) and (C) of FIG. 12 are schematic partial cross-sectional diagrams taken along arrows B-B and C-C in (A) of FIG. 12.

In the semiconductor apparatus of the third example,
a plurality of first memory elements 21 and a plurality of second memory elements 22 are arranged in a two-dimensional matrix in a first direction and a second direction different from the first direction,
the first memory element 21 is formed on the first interlayer insulating layer 67,
the second memory element 22 is formed on a second interlayer insulating layer 68 located above the first interlayer insulating layer 67, and
the first memory element 21 and the second memory element 22 are disposed such that an orthographic projection image of the second memory element 22 on the first interlayer insulating layer 67 and the first memory element 21 are located adjacent to each other along the second direction.

Then, in the nonvolatile memory cell array of the third example, the first memory cell includes one first memory element 21 and one first selection transistor $TR_1$, and the second memory cell includes one second memory element 22 and one second selection transistor $TR_2$. That is, the memory cell constituting the nonvolatile memory cell array of the third example is a so-called "1T-1R"-type memory cell.

Furthermore, in the nonvolatile memory cell array of the third example, an orthographic projection image of the second memory element 22 on the first interlayer insulating layer 67 does not overlap the first memory element 21.

Moreover, the size of the orthographic projection image of the second memory element 22 on the first interlayer insulating layer 67 is different from the size of the first memory element 21. Furthermore, the first interlayer insulating layer 67 covers the first selection transistor $TR_1$ and the second selection transistor $TR_2$, and the second interlayer insulating layer 68 covers the first memory element 21 and the first interlayer insulating layer 67. The sizes of the first memory element 21 and the second memory element 22 are not limited, but examples thereof include the sizes of the first memory element 11 and the second memory element 12 of the first example. However, it is not limited thereto, but the size of the first memory element 21 may be smaller than or the same as the size of the second memory element 22.

In the nonvolatile memory cell arrays of the third to fifth examples, the first memory cell specifically includes, as illustrated in a schematic partial cross-sectional diagram in FIG. 14,
the selection transistor $TR_1$ formed on the semiconductor substrate 60,
the first interlayer insulating layer 67 covering the selection transistor $TR_1$,
the contact hole 66 formed in a portion of the first interlayer insulating layer 67 above the one source/drain region 64A of the selection transistor $TR_1$,
the first wiring 41 (sense line SL) formed on the first interlayer insulating layer 67 and connected to the other source/drain region 64B of the selection transistor $TR_1$ via the connection hole 65 formed in a portion of the first interlayer insulating layer 67 above the other source/drain region 64B of the selection transistor $TR_1$,
the underlying layer 34 formed on the first interlayer insulating layer 67 and connected to the contact hole 66,
the stack structure 30 formed on the underlying layer 34,
the cap layer 35 formed on the stack structure 30, the second interlayer insulating layer 68 formed on the first interlayer insulating layer 67 and surrounding the underlying layer 34, the stack structure 30, and the cap layer 35, the insulating material layer 51 formed on the second interlayer insulating layer 68, the second wiring 42 (bit line BL) formed on the insulating material layer 51, and a contact hole 66" electrically connecting the second wiring 42 and the cap layer 35 and formed in the second interlayer insulating layer 68 and the insulating material layer 51. If necessary, a pad portion in contact with the contact hole 66 may be provided in a portion of the first interlayer insulating layer 67.

Furthermore, the second memory cell specifically includes, as illustrated in a schematic partial cross-sectional diagram in FIG. 15, the selection transistor $TR_2$ formed on the semiconductor substrate 60, the first interlayer insulating layer 67 covering the selection transistor $TR_2$, the first wiring 41 (sense line SL) formed on the first interlayer insulating layer 67 and connected to the other source/drain region 64B of the selection transistor $TR_2$ via the connection hole 65 formed in a portion of the first interlayer insulating layer 67 above the other source/drain region 64B of the selection transistor $TR_2$, the second interlayer insulating layer 68 formed on the first interlayer insulating layer 67, the contact holes 66 and 66' formed in a portion of the first interlayer insulating layer 67 and the second interlayer insulating layer 68 above the one source/drain region 64A of the selection transistor $TR_2$, the underlying layer 34 formed on the second interlayer insulating layer 68 and connected to the contact hole 66', the stack structure 30 formed on the underlying layer 34, the cap layer 35 formed on the stack structure 30, the insulating material layer 51 formed on the second interlayer insulating layer 68 and surrounding the underlying layer 34, the stack structure 30, and the cap layer 35, and the second wiring 42 (bit line BL) formed on the insulating material layer 51 and connected to the cap layer 35. If necessary, a pad portion in contact with the contact hole 66 may be provided in a portion of the first interlayer insulating layer 67, or a pad portion in contact with the contact hole 66' may be provided on the second interlayer insulating layer 68.

In the nonvolatile memory cell array of the third example, since the first memory element and the second memory element are disposed such that the orthographic projection image of the second memory element on the first interlayer insulating layer and the first memory element are located adjacent to each other along the second direction, the formation pitch between the first memory elements on the first interlayer insulating layer on which the first memory elements are formed can be shortened, and the formation pitch between the second memory elements on the second interlayer insulating layer on which the second memory elements are formed can be shortened. That is, for example, it is assumed that the first memory element and the second memory element are alternately formed on the first interlayer insulating layer, and the formation pitch of the first memory element and the second memory element is P'. In the nonvolatile memory cell array of the third example, the formation pitch between the first memory elements on the first interlayer insulating layer on which the first memory elements are formed is 2P', and the formation pitch between the second memory elements on the second interlayer insulating layer on which the second memory elements are formed is also 2P'. Thus, although the value of P' can be shortened, there is no possibility that a short circuit occurs between the memory elements formed on the same interlayer insulating layer. In particular, even when the formation pitch of the nonvolatile memory elements having a large size along the second direction is shortened, there is no possibility that a short circuit occurs between the nonvolatile memory elements adjacent along the second direction (first memory element and first memory element, or second memory element and second memory element). Hence, the size of the memory cell can be easily reduced, a narrow formation pitch can be achieved, and a decrease in the processing margin can be suppressed.

Except for the above points, the configuration and structure of the nonvolatile memory cell array of the third example can be similar to the configuration and structure of the nonvolatile memory cell array of the first example, and thus the detailed description will be omitted.

Figure 16:
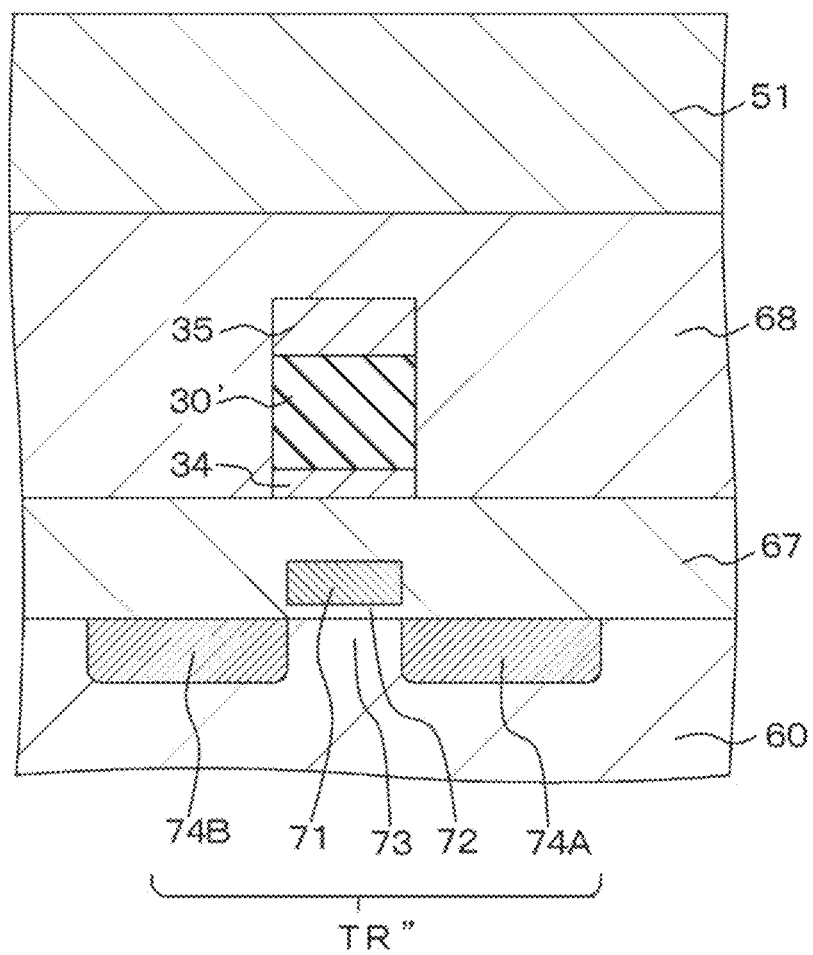
FIG. 16 is a schematic partial cross-sectional diagram of a peripheral circuit constituting the semiconductor apparatus of the third example.
Figure 17:
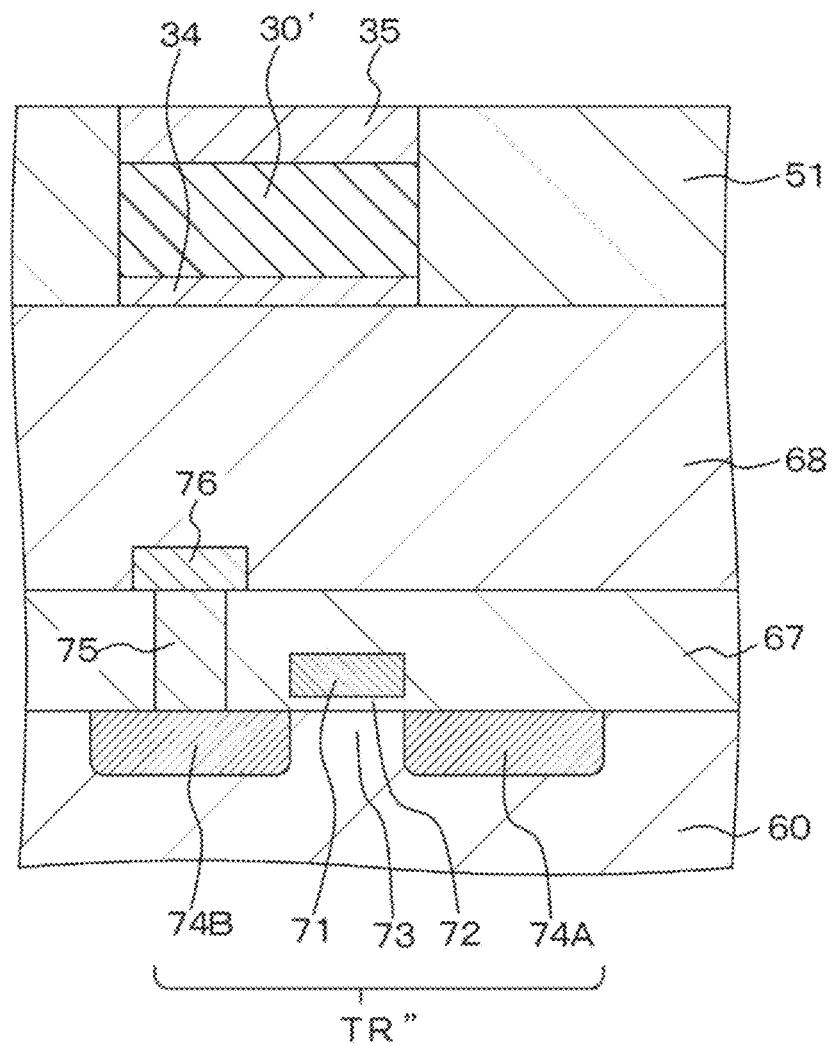
FIG. 17 is a schematic partial cross-sectional diagram of a peripheral circuit constituting the semiconductor apparatus of the third example.
Figure 18:
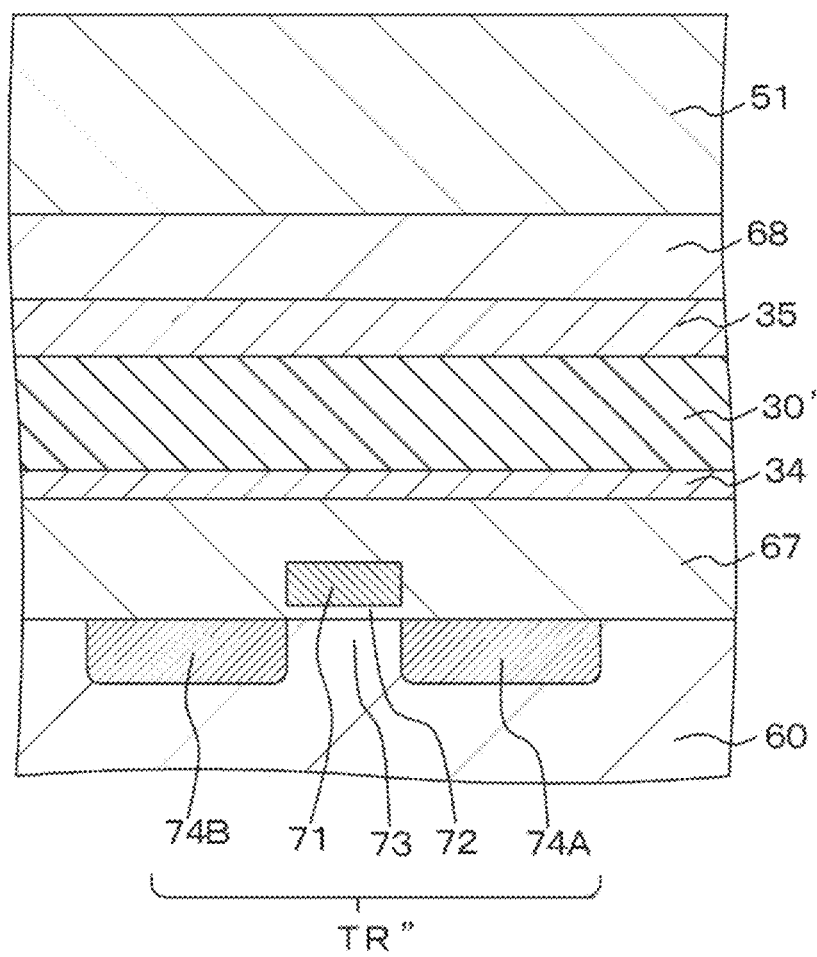
FIG. 18 is a schematic partial cross-sectional diagram of a peripheral circuit constituting the semiconductor apparatus of the third example.
Figure 19:
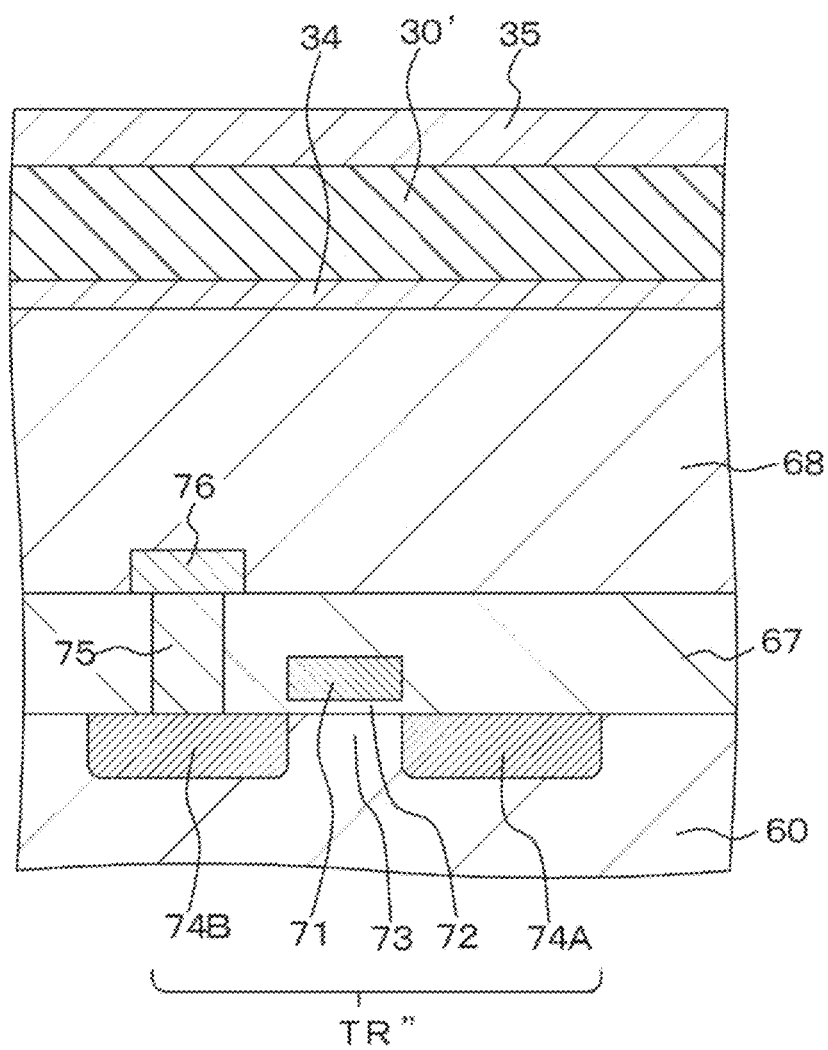
FIG. 19 is a schematic partial cross-sectional diagram of a peripheral circuit constituting the semiconductor apparatus of the third example.

FIGS. 16, 17, 18 and 19 illustrate schematic partial cross-sectional diagrams of a peripheral circuit of a modification of the semiconductor apparatus of the third example. This modification of the semiconductor apparatus further includes a peripheral circuit, and a dummy stack structure 30' having the same configuration as the stack structure 30 constituting the first memory element 21 or the second memory element 22 is formed above the peripheral circuit. The peripheral circuit includes, for example, a sense amplifier and a driver for driving the selection transistor, and includes a transistor TR" similar to that described in the first example. Then, as illustrated in FIG. 16, the dummy stack structure 30' is formed above the gate electrode 71 of the transistor TR" constituting the peripheral circuit. Alternatively, as illustrated in FIG. 17, the dummy stack structure 30' is formed above the gate electrode 71 and the wiring 76 of the transistor TR" constituting the peripheral circuit. The dummy stack structure 30' has the same configuration and structure as the stack structure 30, and is formed on the first interlayer insulating layer 67 or the second interlayer insulating layer 68. The dummy stack structure 30' can be formed simultaneously with the formation of the stack structure 30 illustrated in FIG. 14 or the stack structure 30 illustrated in FIG. 15. An orthographic projection image of the gate electrode 71 of the transistor TR" constituting the peripheral circuit is included in an orthographic projection image of the dummy stack structure 30' on the base portion (silicon semiconductor substrate 60) (see FIG. 16). Alternatively, an orthographic projection image of the gate electrode 71 and the wiring 76 of the transistor TR" constituting the peripheral circuit is included in an orthographic projection image of the dummy stack structure 30' on the base portion (silicon semiconductor substrate 60) (see FIG. 17). Alternatively, as illustrated in FIG. 18, the dummy stack structure 30' may be formed on the first interlayer insulating layer 67 so as to widely cover the transistor TR" constituting the peripheral circuit, and as illustrated in FIG. 19, the dummy stack structure 30' may be formed on the second interlayer insulating layer 68 so as to widely cover the transistor TR" and the wiring 76 constituting the peripheral circuit. Note that reference numeral 75 denotes a connection hole. In the illustrated example, the underlying layer 34 is formed on the lower side of the dummy stack structure 30', and the cap layer 35 is formed on the upper side, but the underlying layer 34 and the cap layer 35 are essentially unnecessary.

FOURTH EXAMPLE

Figure 20:
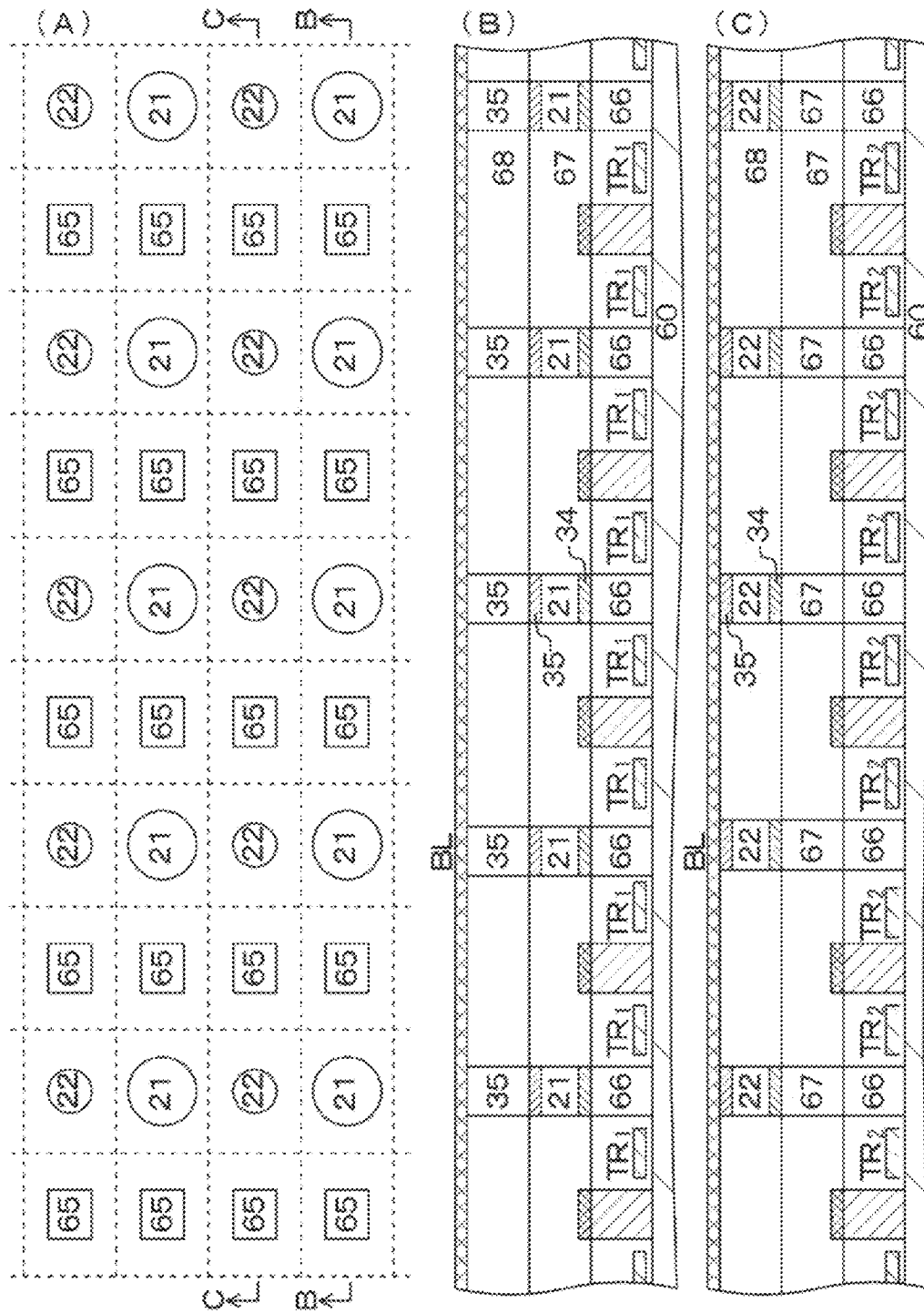
FIG. 20 is a diagram schematically illustrating a disposition state of first memory elements and second memory elements in a nonvolatile memory cell array constituting a semiconductor apparatus of a fourth example, and is a schematic partial cross-sectional diagram of the nonvolatile memory cell array constituting the semiconductor apparatus of the fourth example.
Figure 21:
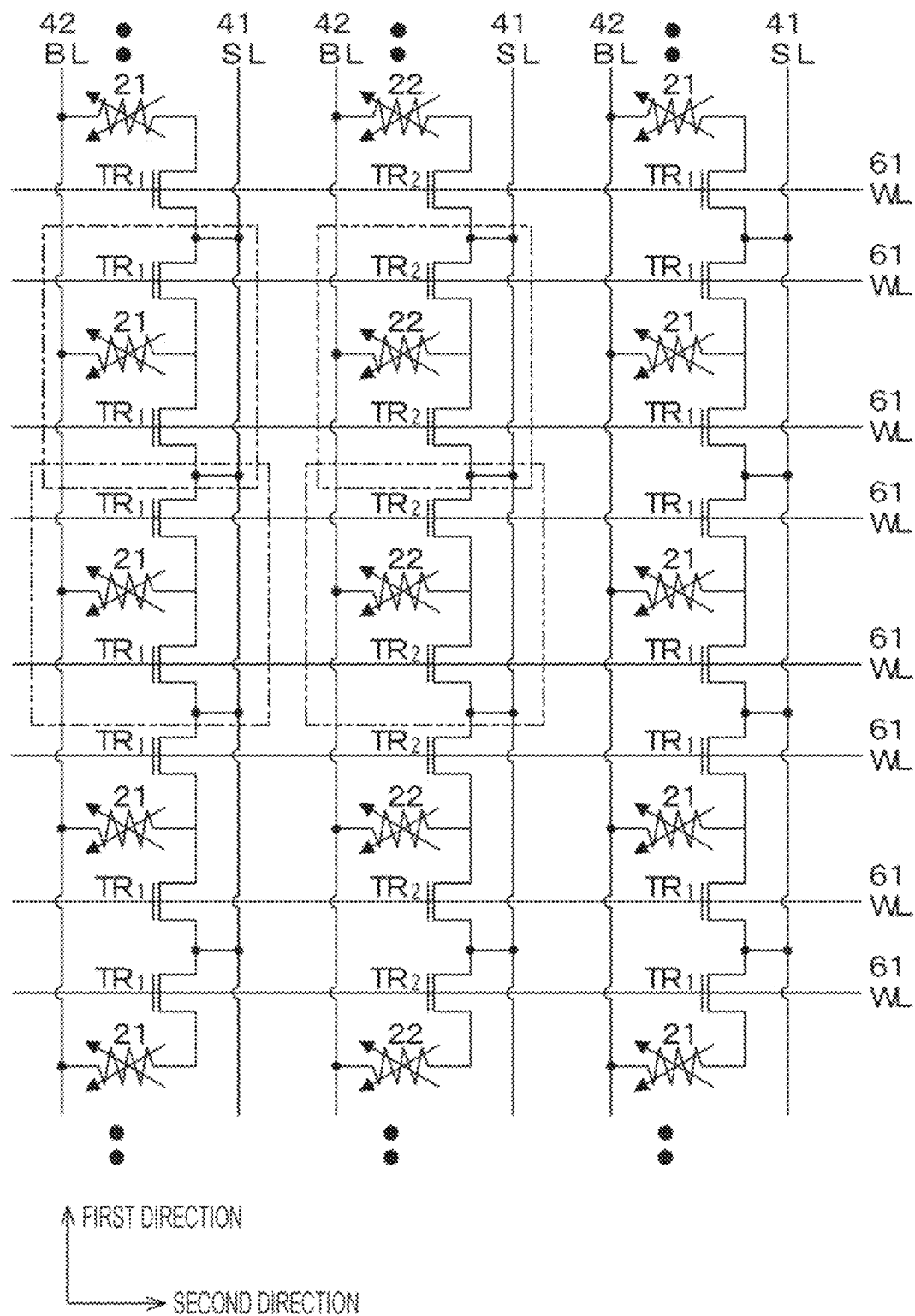
FIG. 21 is an equivalent circuit diagram of a nonvolatile memory cell array constituting the semiconductor apparatus of the fourth example.

The fourth example is a modification of the third example. (A) of FIG. 20 illustrates a diagram schematically illustrating a disposition state of first memory elements and second memory elements in a nonvolatile memory cell array of the fourth example, (B) and (C) of FIG. 20 illustrate schematic partial cross-sectional diagrams of the nonvolatile memory cell array of the fourth example, and FIG. 21 illustrates an equivalent circuit diagram of the nonvolatile memory cell array of the fourth example. Note that (B) and (C) of FIG. 20 are schematic partial cross-sectional diagrams taken along arrows B-B and C-C in (A) of FIG. 20. In FIG. 21, one memory cell is surrounded by the two-dot chain line, and another memory cell is surrounded by the three-dot chain line.

In the nonvolatile memory cell array of the fourth example, the first memory cell includes one first memory element 21 and two first selection transistors $TR_{21}$ (see a memory cell surrounded by the two-dot chain line), and the second memory cell includes one second memory element 22 and two second selection transistors $TR_{22}$ (see a memory cell surrounded by the three-dot chain line. That is, the memory cell constituting the nonvolatile memory cell array of the fourth example is a so-called "2T-1R"-type memory cell, and can also be applied to such "2T-1R"-type memory cell.

Except for the above points, the configuration and structure of the nonvolatile memory cell array of the fourth example can be similar to the configuration and structure of the nonvolatile memory cell array of the first and third examples, and thus the detailed description will be omitted.

FIFTH EXAMPLE

Figure 22:
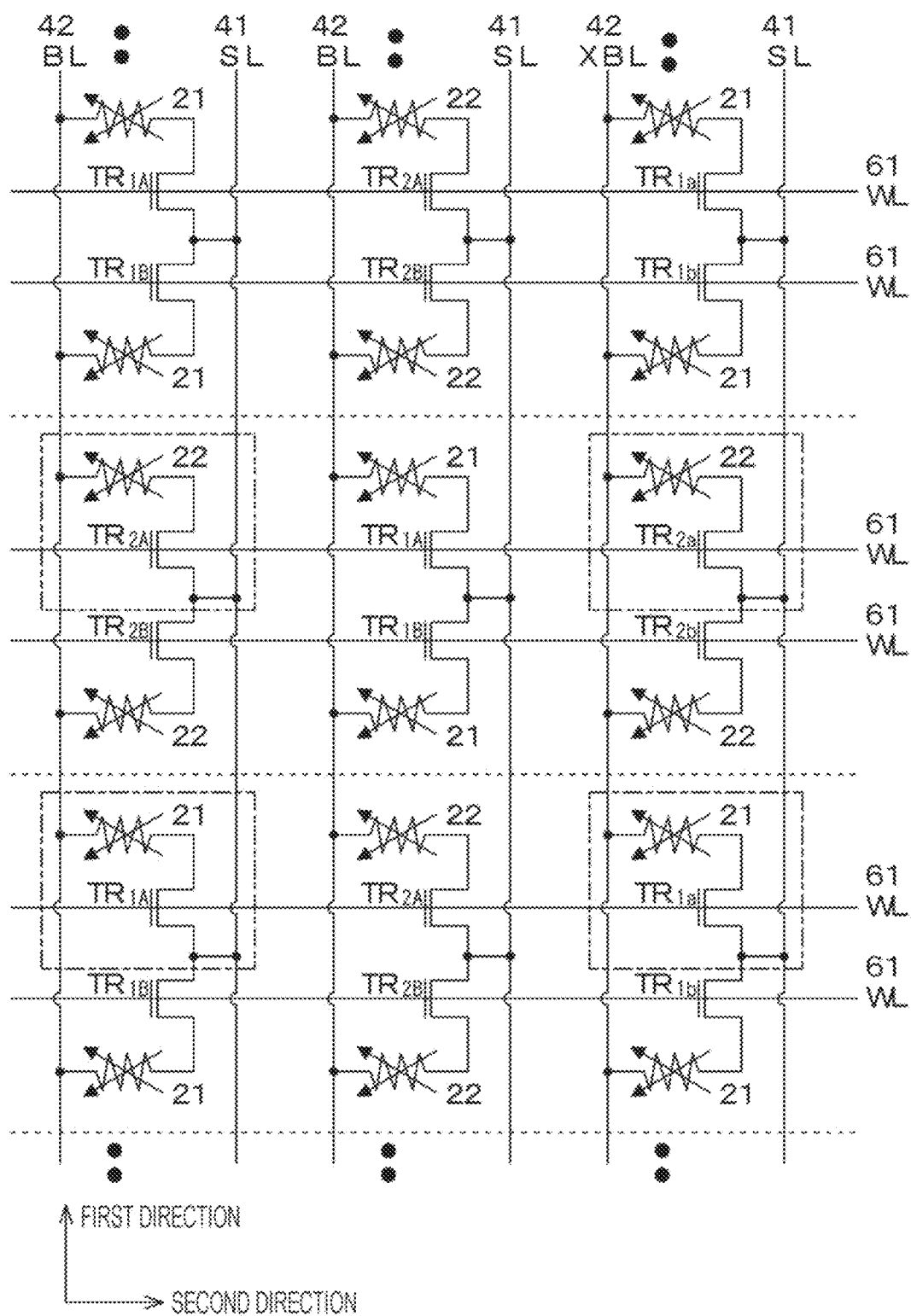
FIG. 22 is an equivalent circuit diagram of a nonvolatile memory cell array constituting the semiconductor apparatus of a fifth example.

The fifth example is also a modification of the third example. FIG. 22 illustrates an equivalent circuit diagram of a nonvolatile memory cell array of the fifth example. Note that a disposition state of first memory elements and second memory elements in the nonvolatile memory cell array of the fifth example and a schematic partial cross-sectional diagram of the nonvolatile memory cell array can be similar to the disposition state of the first memory elements and the second memory elements in the nonvolatile memory cell array of the third example (see (A) of FIG. 12) and the schematic partial cross-sectional diagram of the nonvolatile memory cell array of the third example (see (B) and (C) of FIG. 12). In FIG. 22, the first memory cells operating as a pair are surrounded by the one-dot chain line, and the second memory cells operating as a pair are surrounded by the two-dot chain line.

In the nonvolatile memory cell array of the fifth example, the first memory cell includes two first memory elements 21 and two first selection transistors $TR_{1A}$, $TR_{1B}$, $TR_{1a}$, and $TR_{1b}$, and the second memory cell includes two second memory elements 22 and two second selection transistors $TR_{2A}$, $TR_{2B}$, $TR_{2a}$, and $TR_{2b}$. That is, the memory cell constituting the nonvolatile memory cell array of the fifth example is a so-called "2T-2R"-type memory cell. By using such a "2T-2R"-type memory cell and storing one piece of data in two memory cells (two bits), it is possible to increase the speed of data reading. Note that one of the paired memory cells is connected to the bit line BL, and the other is connected to a bit line XBL.

Except for the above points, the configuration and structure of the nonvolatile memory cell array of the fifth example can be similar to the configuration and structure of the nonvolatile memory cell array of the first and third examples, and thus the detailed description will be omitted.

SIXTH EXAMPLE

The sixth example relates to an electronic device including the nonvolatile memory cell array described in the first to fifth examples, specifically, a magnetic head. The magnetic head can be applied to, for example, various electronic equipment, electric equipment, and the like including a hard disk drive, an integrated circuit chip, a personal computer, a mobile terminal, a mobile phone, magnetic sensor equipment.

Figure 23A:
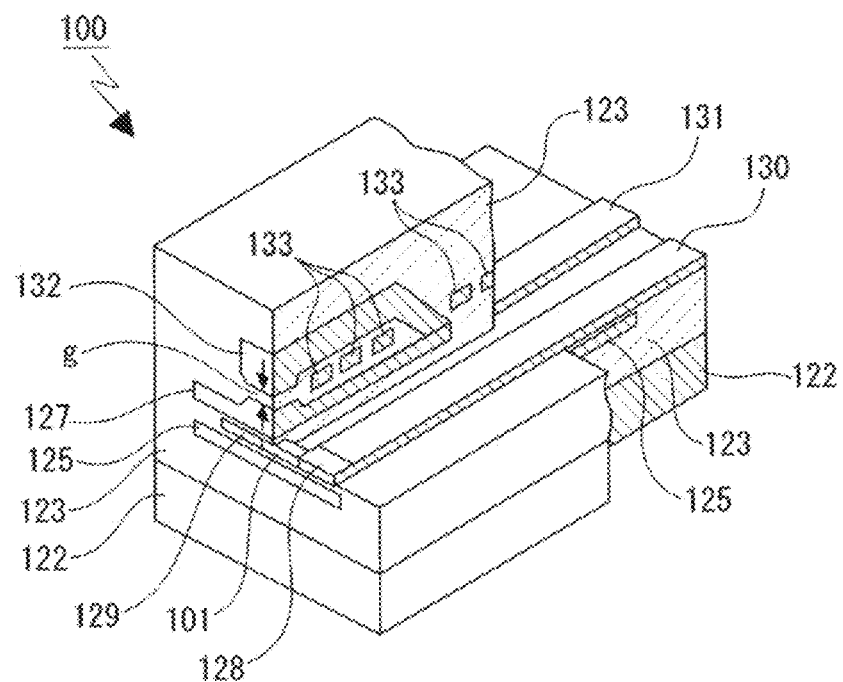
FIGS. 23A and 23B are a schematic perspective diagram illustrating a part of a combined magnetic head of a sixth example cut away, and a schematic cross-sectional diagram of the combined magnetic head of the sixth example, respectively.
Figure 23B:
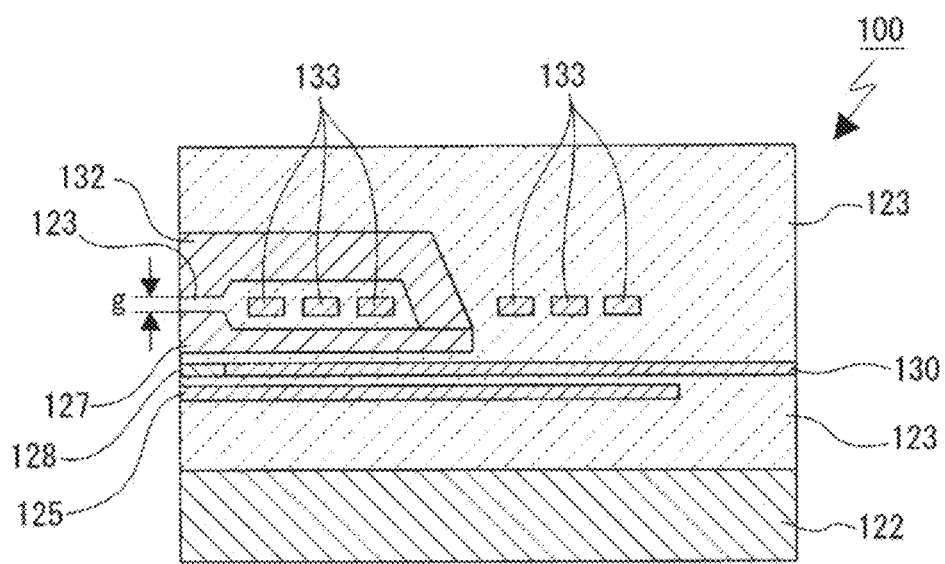

As an example, FIGS. 23A and 23B illustrate an example in which a magneto-resistive portion 101 including the nonvolatile memory cell array described in the first to fifth examples is applied to a combined magnetic head 100. Note that FIG. 23A is a schematic perspective diagram illustrating the combined magnetic head 100 with a part cut away so that the internal structure can be seen, and FIG. 23B is a schematic cross-sectional diagram of the combined magnetic head 100.

The combined magnetic head 100 is a magnetic head used for a hard disk apparatus or the like, a magnetoresistance effect type magnetic head including the nonvolatile memory cell array described in the first to fifth examples is formed on a substrate 122, and an inductive magnetic head is further stacked and formed on the magnetoresistance effect type magnetic head. Here, the magnetoresistance effect type magnetic head operates as a reproducing head, and the inductive magnetic head operates as a recording head. That is, in the combined magnetic head 100, the reproducing head and the recording head are combined.

The magnetoresistance effect type magnetic head mounted on the combined magnetic head 100 is a so-called shield type MR head, and includes a first magnetic shield layer 125 formed on the substrate 122 via an insulating layer 123, a magneto-resistive portion 101 formed on the first magnetic shield layer 125 via the insulating layer 123, and a second magnetic shield layer 127 formed on the magneto-resistive portion 101 via the insulating layer 123. The insulating layer 123 includes an insulating material such as $Al_2O_3$ or $SiO_2$. The first magnetic shield layer 125 is for magnetically shielding the lower layer side of the magneto-resistive portion 101, and includes a soft magnetic material such as Ni—Fe. The magneto-resistive portion 101 is formed on the first magnetic shield layer 125 via the insulating layer 123. The magneto-resistive portion 101 functions as a magnetosensitive element that detects a magnetic signal from a magnetic recording medium in the magnetoresistance effect type magnetic head. The shape of the magneto-resistive portion 101 is a substantially rectangular shape, and one side surface is exposed as a surface facing the magnetic recording medium. Then, bias layers 128 and 129 are disposed at both ends of the magneto-resistive portion 101. Furthermore, connection terminals 130 and 131 connected to the bias layers 128 and 129 are formed. A sense current is supplied to the magneto-resistive portion 101 via the connection terminals 130 and 131. The second magnetic shield layer 127 is provided above the bias layers 128 and 129 via the insulating layer 123.

The inductive magnetic head stacked and formed on the magnetoresistance effect type magnetic head includes a magnetic core including a second magnetic shield layer 127 and an upper core 132, and a thin film coil 133 formed so as to be wound around the magnetic core. The upper core 132 forms a closed magnetic path together with the second magnetic shield layer 127, serves as the magnetic core of the inductive magnetic head, and includes a soft magnetic material such as Ni—Fe or the like. Here, the second magnetic shield layer 127 and the upper core 132 are formed such that front end portions thereof are exposed as surfaces facing the magnetic recording medium, and the second magnetic shield layer 127 and the upper core 132 are in contact with each other at the rear end portions thereof. Here, the front end portions of the second magnetic shield layer 127 and the upper core 132 are formed such that the second magnetic shield layer 127 and the upper core 132 are spaced apart from each other with a predetermined gap g on the surface facing the magnetic recording medium. That is, in the combined magnetic head 100, the second magnetic shield layer 127 not only magnetically shields the upper layer side of the magneto-resistive portion 101, but also serves as the magnetic core of the inductive magnetic head, and the second magnetic shield layer 127 and the upper core 132 constitute the magnetic core of the inductive magnetic head. Then, the gap g becomes a recording magnetic gap of the inductive magnetic head.

Furthermore, above the second magnetic shield layer 127, the thin film coil 133 embedded in the insulating layer 123 is formed. The thin film coil 133 is formed so as to be wound around the magnetic core including the second magnetic shield layer 127 and the upper core 132. Although not illustrated, both end portions of the thin film coil 133 are exposed to the outside, and terminals formed at both ends of the thin film coil 133 serve as external connection terminals of the inductive magnetic head. That is, at the time of recording a magnetic signal on the magnetic recording medium, a recording current is supplied from these external connection terminals to the thin film coil 133.

The combined magnetic head 100 as described above is equipped with the magnetoresistance effect type magnetic head as the reproducing head, and the magnetoresistance effect type magnetic head includes the magneto-resistive portion 101 described in the first to fifth examples as a magnetosensitive element that detects a magnetic signal from the magnetic recording medium. Then, since the magneto-resistive portion 101 exhibits very excellent characteristics as described above, this magnetoresistance effect type magnetic head can cope with a further increase in recording density of magnetic recording.

The present disclosure has been described above on the basis of preferred examples, but the present disclosure is not limited to these examples. The disposition states of the first memory cell and the second memory cell described in the examples, various multilayered structures constituting the nonvolatile memory element, the materials used, and the like are examples, and can be appropriately changed.

Figure 24A:
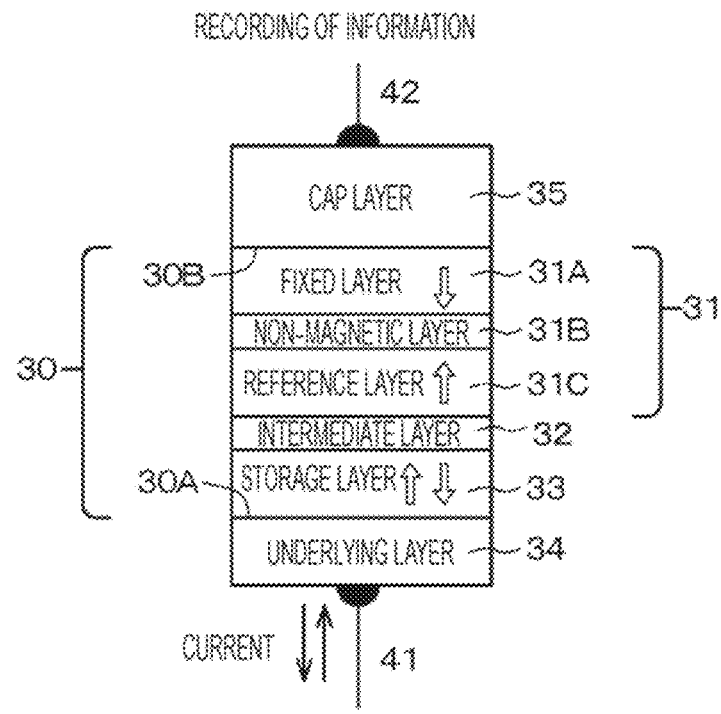
FIGS. 24A and 24B are conceptual diagrams of a modification of the nonvolatile memory element.
Figure 24B:
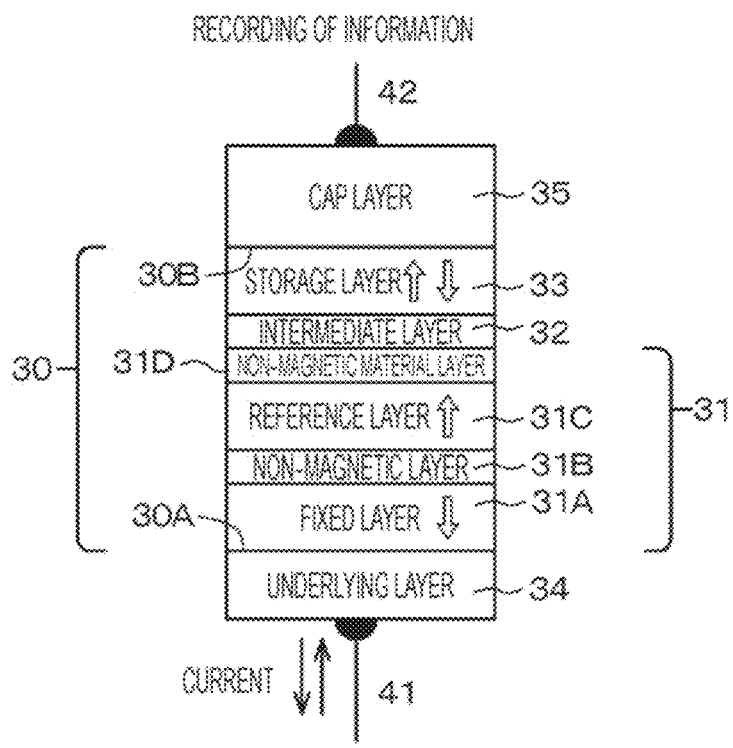

As illustrated in a conceptual diagram of a modification of the nonvolatile memory element in FIG. 24A, in each example, the spin transfer torque based magnetic random access memory having the structure in which the storage layer 33 is located at the uppermost layer of the stack structure 30 has been described, but, by reversing the stacking order of the layers in the stack structure 30, spin transfer torque based magnetic random access memory having a structure in which the storage layer 33 is located at the lowermost layer in the stack structure 30 can also be obtained. Alternatively, as illustrated in a conceptual diagram of a modification of the nonvolatile memory element in FIG. 24B, the multilayered ferri-structure may further include a non-magnetic material layer 31D including at least one element selected from the group consisting of vanadium, chromium, niobium, molybdenum, tantalum, tungsten, hafnium, zirconium, titanium, and ruthenium between one magnetic material layer (reference layer) 31C constituting the multilayered ferri-structure and the stack structure 30.

Furthermore, the insulating material layer 51 can be in a form of having magnetism, and in this case, it is sufficient if the insulating material layer 51 includes, for example, iron oxide ($FeO_x$).

In the first and second examples, the nonvolatile memory cell array includes the two types: the first memory cell and the second memory cell, but can additionally include three or more types of memory cells: a third memory cell, a fourth memory cell . . . , and the like. Then, in this case, it is sufficient if the nonvolatile memory element having the largest size is a first memory element and the nonvolatile memory element having the second largest size is a second memory element and the first memory element and the second memory element are disposed adjacent to each other along the second direction. In other words, it is sufficient if the first memory element and the first memory element are disposed so as not to be adjacent to each other along the second direction.

Figure 25A:
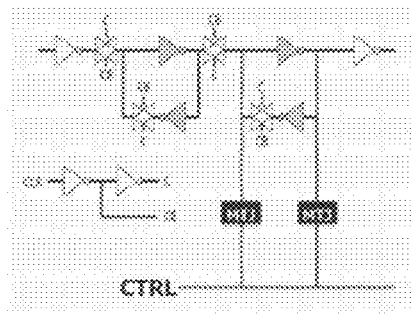
FIGS. 25A, 25B, 25C, and 25D are circuit diagrams of a digital flip-flop circuit in a case where the nonvolatile memory cell array of the present disclosure is used as a latch circuit of a logic circuit (specifically, for example, a digital flip-flop circuit).
Figure 25B:
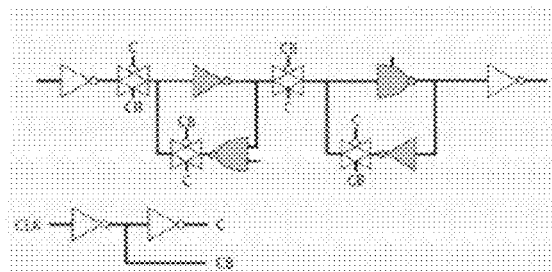
Figure 25C:
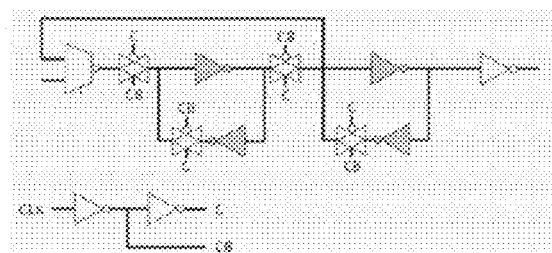
Figure 25D:
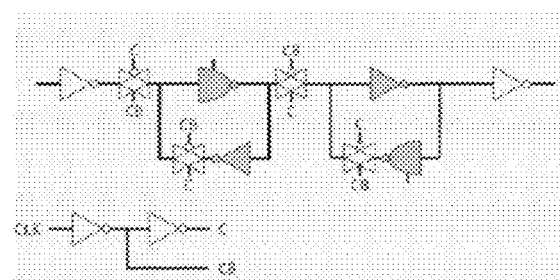

Furthermore, the nonvolatile memory cell array constituting the semiconductor apparatus of the present disclosure can be used as a latch circuit (see FIGS. 25A, 25B, 25C, and 25D) of a logic circuit (for example, a digital flip-flop circuit). As an example, FIG. 25A illustrates an equivalent circuit diagram incorporating the nonvolatile memory element (indicated by "MTJ" in FIG. 25A) constituting the nonvolatile memory cell array of the present disclosure connected to a control line CTRL.

In the examples, the base portion includes a silicon semiconductor substrate, but alternatively the base portion can include an SOI substrate (specifically, a silicon layer constituting an SOI substrate or the like). Alternatively, instead of the silicon layer, the base portion can include an InGaAs layer or a Ge layer, and the selection transistor TR can be formed on the InGaAs layer or Ge layer.

In the examples, the magnetic random access memory, specifically, the perpendicular magnetization-type spin transfer torque based magnetic random access memory has been described as an example, but the nonvolatile memory element is not limited thereto, and any nonvolatile memory element can be applied as long as it is a resistance-variable nonvolatile memory element. That is, examples include (a) a nonvolatile memory element including a resistance variable layer including an ion conductor including metal (b) a nonvolatile memory element including a resistance variable layer including a multilayered structure of a high resistance layer and an ion source layer (ion supply source layer)

(c) a nonvolatile memory element including a resistance variable layer including chalcogenide-based material (d) a nonvolatile memory element including a resistance variable layer including a material having colossal electroresistance effect (CER effect)

(e) a nonvolatile memory element including a resistance variable layer including a material having a colossal magnetoresistance effect (CMR effect) and (f) a phase-change nonvolatile memory element (PRAM) or a programmable metallization cell (PMC) that is operated as a nonvolatile memory element by utilizing the fact that a phase-change material constituting a resistance variable layer has an electrical resistance that differs by several orders of magnitude between an amorphous state and a crystalline state (g) resistance random access memory (ReRAM) in which a metal oxide is sandwiched between two electrodes and a pulse voltage is applied to the electrodes (h) a nonvolatile memory element including an interelectrode substance layer provided between electrodes, and an oxidation-reduction reaction active substance that can serve as an electrode reaction inhibition layer depending on the state of application of voltage between the electrodes, in which the electrode reaction inhibition layer is formed or eliminated along an interface region between the electrodes and the interelectrode substance layer depending on the state of application of voltage between the electrodes, or an area of the electrode reaction inhibition layer is increased or decreased, and these nonvolatile memory elements can be applied as the nonvolatile memory element constituting the nonvolatile memory cell array of the present disclosure.

In a case where the resistance variable layer includes an ion conductor including a metal, specifically, the resistance variable layer can include a conductive or semiconductive thin film (for example, a thin film including GeSbTe, GeTe, GeSe, GeS, SiGeTe, and SiGeSbTe) including at least one element (atom) selected from the group consisting of copper (Cu), silver (Ag), and zinc (Zn) and at least one element (chalcogen) (atom) selected from the group consisting of tellurium (Te), sulfur (S), and selenium (Se). Note that a multilayered structure of the above thin film and a thin film including, for example, Ag, an Ag alloy, Cu, a Cu alloy, Zn, and a Zn alloy may be adopted, or a film (rare earth oxide thin film) including an oxide of at least one rare earth element selected from the group consisting of La, Ce, Pr, Nd, Sm, Eu, Gd, Tb, Dy, Ho, Er, Yb and Y among the rare earth elements, or an oxide film such as of Hf, Ta, and W may be configured to be formed on the whole or a part of these thin films in the film thickness direction. Alternatively, it can be configured to include a conductive or semiconductive thin film (for example, an amorphous thin film including GeSbTeGd) including at least one element (atom) selected from the group consisting of germanium (Ge), silicon (Si), antimony (Sb), and indium (In) and at least one element (chalcogen) (atom) selected from the group consisting of tellurium (Te), sulfur (S), and selenium (Se).

In a case where the resistance variable layer includes the multilayered structure of a high resistance layer and an ion source layer, specifically, the ion source layer can be configured to include at least one metal element as a cationizable element, and moreover, include at least one element (chalcogen) (atom) selected from the group consisting of tellurium (Te), sulfur (S), and selenium (Se) as an anionizable element. The metal element and chalcogen are bonded to form a metal chalcogenide layer (chalcogenide-based material layer). The metal chalcogenide layer mainly has an amorphous structure and serves as an ion supply source. Here, the ion source layer is formed to have a lower resistance value than the high resistance layer in the initial state or the erased state.

The metal element constituting the metal chalcogenide layer is preferably a chemically stable element that can exist in a metal state in the ion source layer including chalcogen described above so as to be reduced on the electrode during the write operation to form a metal-state conduction path (filament), examples of such a metal element include copper (Cu), aluminum (Al), germanium (Ge), and zinc (Zn), and transition metals of groups 4A, 5A, and 6A on the periodic table, that is, Ti (titanium), Zr (zirconium), Hf (hafnium), V (vanadium), Nb (niobium), Ta (tantalum), Cr (chromium), Mo (molybdenum), and W (tungsten), and one or two or more of these elements can be used. Furthermore, Al (aluminum), Cu (copper), Ge (germanium), Si (silicon), or the like may be used as an additive element to the ion source layer.

Specific examples of the constituent material of the ion source layer include ZrTeAl, TiTeAl, CrTeAl, WTeAl, TaTeAl, and CuTe. Furthermore, for example, CuZrTeAl in which Cu is added to ZrTeAl, CuZrTeAlGe in which Ge is further added, and CuZrTeAlSiGe in which Si is further added as an additive element can also be exemplified. Alternatively, ZrTeMg using Mg instead of Al can also be exemplified. Even in a case where another transition metal element such as titanium (Ti) or tantalum (Ta) is selected instead of zirconium (Zr) as the metal element constituting the metal chalcogenide layer, a similar additive element can be used, and specific examples of the constituent material of the ion source layer can include TaTeAlGe or the like. Moreover, sulfur (S), selenium (Se), and iodine (I) may be used in addition to tellurium (Te), and specific examples of the constituent material of the ion source layer can include ZrSAl, ZrSeAl, ZrIAl, or the like.

Alternatively, when the metal element constituting the metal chalcogenide layer includes a metal element (M) that easily reacts with tellurium (Te) included in the high resistance layer to form a multilayered structure such as a Te/ion source layer (including the metal element M), a stabilized structure of an M-Te/ion source layer can be obtained by heating treatment after film formation. Here, examples of the metal element (M) that easily reacts with tellurium (Te) include aluminum (Al) and magnesium (Mg).

Note that other elements may be added to the ion source layer for the purpose of, for example, suppressing film separation at the time of high-temperature heating treatment when the resistance variable layer is formed. For example, silicon (Si) is an additive element with which holding characteristics can be expected to be improved at the same time, and for example, silicon (Si) is preferably added to the ion source layer together with zirconium (Zr). However, when the amount of silicon (Si) added is too small, the effect of preventing film separation cannot be expected, and when the amount is too large, favorable memory operation characteristics cannot be obtained, and therefore, the content of silicon (Si) in the ion source layer is preferably in a range of about 10 to 45 atom %.

When a predetermined voltage is applied to the nonvolatile memory element, at least one metal element as a cationizable element diffuses into the high resistance layer, so that the resistance value of the high resistance layer decreases. Then, the high resistance layer has a function as a barrier in electric conduction, and exhibits a resistance value higher than that of the ion source layer when a predetermined voltage is applied between the electrode and the conductive material layer (or wiring) in the initialized state or the erased state. As described above, the high resistance layer includes, for example, a layer including a compound mainly including tellurium (Te) that behaves as an anion component. Specifically, examples of such a compound include AlTe, MgTe, ZnTe, or the like. In the composition of the compound containing tellurium (Te), for example, in AlTe, the content of aluminum (Al) is preferably 20 atom % or more and 60 atom % or less. Alternatively, the high resistance layer may include an oxide such as aluminum oxide ($AlO_x$). Furthermore, the initial resistance value of the high resistance layer is preferably 1 MΩ or more, and the resistance value in a low resistance state is preferably several 100 kΩ or less. That is, the nonvolatile memory element stores information or the like by changing the resistance value of the high resistance layer. In order to read the resistance state of a miniaturized nonvolatile memory element at high speed, it is preferable to reduce the resistance value in the low resistance state as much as possible. However, since the resistance value in a case where information (data) or the like is written under the conditions of 20 pA to 50 pA and 2 V is 40 kΩ to 100 kΩ, the initial resistance value of the nonvolatile memory element is assumed to be higher than such values. Moreover, considering a resistance separation width of one digit, the resistance value described above is considered to be appropriate. Note that the high resistance layer can have not only a single-layer configuration but also a multilayer configuration, and in this case, a lower layer including the most tellurium as an anion component is in contact with a high resistance layer-side electrode, and an upper layer includes an element as an anion component other than tellurium. Alternatively, examples of the high resistance layer include SiN, $SiO_2$, and $Gd_2O_3$, and also include a material including fluorine (for example, $MgF_2$, $AlF_3$, $CaF_2$, and LiF).

Here, when tellurium (Te) is included most as an anion component in the high resistance layer, the metal element diffused in the high resistance layer is stabilized when the resistance of the high resistance layer is reduced, and the low resistance state is easily maintained. On the other hand, tellurium (Te) has a weaker bonding force with a metal element than an oxide or a silicon compound, and the metal element diffused in the high resistance layer easily moves to the ion source layer, so that the erasing characteristics are improved. That is, the write data holding characteristics in the low resistance state are improved, and the voltage can be reduced at the time of data erasing. Moreover, it is possible to reduce the variation in the resistance value in the erased state for a large number of times of write/erase operations. Note that the absolute value of the electronegativity generally increases in the order of tellurium<selenium<sulfur<oxygen in the chalcogenide compound, and thus the improvement effect is higher as the amount of oxygen in the high resistance layer is smaller and the chalcogenide having a lower electronegativity is used.

Examples of a material constituting the electrode include W (tungsten), WN (tungsten nitride), Cu (copper), Al (aluminum), Mo (molybdenum), Au (gold), Pt (platinum), Ti (titanium), TiN (titanium nitride), TiW (titanium-tungsten), Mo (molybdenum), Ta (tantalum), silicide, or the like. Note that in a case where the electrode includes a material such as copper (Cu) that can cause ion conduction in an electric field, the surface of the electrode may be coated with a material such as tungsten (W), tungsten nitride (WN), titanium nitride (TiN), tantalum nitride (TaN), or the like that hardly conducts ions or thermally diffuses. Furthermore, in a case where Al (aluminum) is included in the ion source layer, examples of a material constituting the electrode include a material that is less likely to be ionized than Al (aluminum), for example, a metal film including at least one of Cr (chromium), W (tungsten), Co (cobalt), Si (silicon), Au (gold), Pd (palladium), Mo (molybdenum), Ir (iridium), Ti (titanium), or the like, or an oxide film or a nitride film thereof. As the conductive material layer (or wiring), a known conductive material including a conductive material similar to that of the electrode can be used. Alternatively, it may have a multilayered structure of an underlying layer including Cr, Ti, or the like, and a Cu layer, an Au layer, a Pt layer, or the like formed thereon. Moreover, it can also include a single layer such as of Ta or the like or a multilayered structure with Cu, Ti, or the like. The electrode and the conductive material layer (or wiring) can be formed by, for example, a PVD method exemplified by a sputtering method, or a CVD method.

When information is stored (written), a voltage pulse in the "positive direction" (for example, the high resistance layer is negative potential, and the ion source layer side is positive potential) is applied to the nonvolatile memory element in the initial state (high resistance state). As a result, the metal element included in the ion source layer is ionized and diffused into the high resistance layer, and is bonded to electrons on the electrode so as to be deposited, or remains in the high resistance layer to form an impurity level. In this way, a conduction path including the metal element is formed in the information storage layer, more specifically, in the high resistance layer, and the resistance of the information storage layer decreases (information storage state). Thereafter, even when a voltage is not applied to the nonvolatile memory element, the information storage layer is held in the low resistance state. Thus, information is written and held. In the case of use in a storage apparatus in which writing can be performed only once, so-called programmable read only memory (PROM), information storage (recording) is completed only by this information storage process. On the other hand, a rewriting process is necessary for application to a storage apparatus capable of rewriting information a plurality of times, that is, random access memory (RAM), EEPROM, or the like. When information is written, a voltage pulse in the "negative direction" (for example, the high resistance layer is positive potential, and the ion source layer side is negative potential) is applied to the nonvolatile memory element in the low resistance state. As a result, the metal element deposited on the electrode is ionized and dissolved in the ion source layer. Thus, the conduction path including the metal element disappears, and the high resistance layer becomes in a high resistance state (initial state or erased state). Thereafter, even when a voltage is not applied to the nonvolatile memory element, the information storage layer is held in the high resistance state. In this way, the written information is erased. By repeating such a process, writing of information to the nonvolatile memory element and erasing of the written information can be repeated. In reading the information stored in the nonvolatile memory element, for example, a voltage in the "positive direction" (for example, the high resistance layer is negative potential, and the ion source layer side is positive potential) is applied, but the value thereof is lower than the value of the voltage applied when the information is stored (written). For example, when the high resistance state corresponds to information of "0" and the low resistance state corresponds to information of "1", "0" is changed to "1" in the information writing process, and "1" is changed to "0" in the information erasing process. Note that, although the operation for setting the low resistance state and the operation for setting the high resistance state correspond to the write operation and the erase operation, respectively, the erase operation and the write operation may correspond to the opposite resistance states.

In a case where the resistance variable layer includes a chalcogenide-based material, examples of the chalcogenide-based material include compounds of a metal and Se or Te such as GeSbTe, ZnSe, GaSnTe, or the like.

Furthermore, in a case where the resistance variable layer includes a material having the colossal electroresistance effect (CER effect), examples of such a material can include a ternary perovskite transition metal oxide ($PrCaMnO_3$ and $SrTiO_3$) and binary transition metal oxide (CiO, NiO, CuO, $TiO_2$, $Fe_3O_4$).

Furthermore, in order to operate the phase-change material constituting the resistance variable layer of the phase-change nonvolatile memory element by utilizing the fact that the electrical resistance differs by several orders of magnitude between the amorphous state and the crystalline state, the resistance variable layer includes a chalcogenide-based material. Then, when the resistance variable layer is rapidly cooled after a pulsed large current (for example, 200 microamps, 20 nanoseconds) is applied for a short period of time, the phase-change material constituting the resistance variable layer becomes an amorphous state and exhibits high resistance. On the other hand, when the resistance variable layer is slowly cooled after a pulsed small current (for example, 100 microamps, 100 nanoseconds) is applied for a relatively long period of time, the phase-change material constituting the resistance variable layer becomes a crystalline state and exhibits low resistance.

Furthermore, the ReRAM includes a multinary metal oxide including a plurality of metal elements such as a perovskite metal oxide and oxygen, or includes a binary metal oxide including one metal element and oxygen, and can be a unipolar (non-polar) type or a bipolar type, or can be a filament type (fuse/antifuse type) or an interface type.

In the nonvolatile memory element in which the interelectrode substance layer is provided, the electrode reaction inhibition layer is formed or eliminated, or an area is increased or decreased, the oxidation-reduction reaction active substance layer includes at least one selected from the group consisting of nickel (Ni), cobalt (Co), chromium (Cr), titanium (Ti), tantalum (Ta), iron (Fe), aluminum (Al), vanadium (V), a reduced product ($H_xWO_3$) of tungsten oxide ($WO_3$), and an oxide of vanadium (V). Furthermore, the interelectrode substance layer includes, as a base material, an amorphous thin film including at least one of chalcogenide materials such as sulfur (S), selenium (Se), and tellurium (Te), and at least one of germanium (Ge), silicon (Si), antimony (Sb), or indium (In).

The features of the peripheral circuit in the semiconductor apparatus of the present disclosure can also be applied to a semiconductor apparatus including a conventional memory cell. That is, the semiconductor apparatus includes:
a nonvolatile memory cell array including a plurality of memory cells each including
a resistance-variable nonvolatile memory element, and
a selection transistor electrically connected to the nonvolatile memory element, and
a peripheral circuit, in which
a dummy stack structure having the same configuration as a stack structure constituting the nonvolatile memory element is formed above the peripheral circuit. The nonvolatile memory element, the selection transistor, the memory cell, the peripheral circuit, and the dummy stack structure have the similar configuration and structure as those of the nonvolatile memory element, the selection transistor, the memory cell, the peripheral circuit, and the dummy stack structure described with respect to the semiconductor apparatus of the present disclosure.

Note that the present disclosure may adopt the configuration described below.

[A01]<<Semiconductor apparatus . . . First aspect>>
A semiconductor apparatus including a nonvolatile memory cell array including:
a plurality of first memory cells, each of the plurality of first memory cells including a first memory element including a resistance-variable nonvolatile memory element and a first selection transistor electrically connected to the first memory element, and
a plurality of second memory cells, each of the plurality of second memory cells including a second memory element including a resistance-variable nonvolatile memory element and a second selection transistor electrically connected to the second memory element, in which
a plurality of first memory elements and a plurality of second memory elements are arranged in a two-dimensional matrix in a first direction and a second direction different from the first direction and on the same interlayer insulating layer,
the first memory element is larger than the second memory element, and
the first memory element and the second memory element are disposed adjacent to each other along the second direction.

[A02] The semiconductor apparatus according to [A01], in which
a first memory element group including the plurality of first memory elements is arranged along the first direction,
a second memory element group including the plurality of second memory elements is arranged along the first direction, and
the first memory element group and the second memory element group are alternately arranged along the second direction.

[A03] The semiconductor apparatus according to [A02], in which
when an area of the first memory element is $S_1$ and an area of the second memory element is $S_2$, $1 \leq S_1/S_2 \leq 10$ is satisfied.

[A04] The semiconductor apparatus according to [A03], in which
when a formation pitch of the first memory element and the second memory element along the second direction is $P_{2-12}$, $1.1 \leq P_{2-12}/R_1 \leq 10$ is satisfied, but $S_1 = \Pi(R_1/2)^2$.

[A05] The semiconductor apparatus according to [A04], in which
when a formation pitch of the first memory element and the first memory element along the first direction is $P_{1-12}$, $2 \leq P_{1-12}/R_1 \leq 20$ is satisfied.

[A06] The semiconductor apparatus according to [A01], in which the first memory element and the second memory element are alternately arranged along the first direction.

[A07] The semiconductor apparatus according to [A06], in which
when an area of the first memory element is $S_1$ and an area of the second memory element is $S_2$, $1 < S_1/S_2 \leq 10$ is satisfied.

[A08] The semiconductor apparatus according to [A07], in which
when a formation pitch of the first memory element and the second memory element along the first direction is $P_{1-12}'$, and a formation pitch of the first memory element and the second memory element along the second direction is $P_{2-12}'$, $$2 \leq P_{1-12}'/R_1 \leq 20$$

$$1 \leq P_{2-12}'/R_1 \leq 10$$

are satisfied, but $$S_1 = \Pi(R_1/2)^2.$$

[A09] The semiconductor apparatus according to any one of [A01] to [A08], in which the first memory element and the second memory element have different thermal stability.

[B01]<<Semiconductor apparatus . . . Second aspect>>

A semiconductor apparatus including a nonvolatile memory cell array including:
- a plurality of first memory cells, each of the plurality of first memory cells including a first memory element including a resistance-variable nonvolatile memory element and a first selection transistor electrically connected to the first memory element, and
- a plurality of second memory cells, each of the plurality of second memory cells including a second memory element including a resistance-variable nonvolatile memory element and a second selection transistor electrically connected to the second memory element, in which
- a plurality of first memory elements and a plurality of second memory elements are arranged in a two-dimensional matrix in a first direction and a second direction different from the first direction,
- the first memory element is formed on a first interlayer insulating layer,
- the second memory element is formed on a second interlayer insulating layer located above the first interlayer insulating layer, and
- the first memory element and the second memory element are disposed such that an orthographic projection image of the second memory element on the first interlayer insulating layer and the first memory element are located adjacent to each other along the second direction.

[B02] The semiconductor apparatus according to [B01], in which an orthographic projection image of the second memory element on the first interlayer insulating layer does not overlap the first memory element.

[B03] The semiconductor apparatus according [B01] or [B02], in which a size of an orthographic projection image of the second memory element on the first interlayer insulating layer is different from a size of the first memory element.

[B04] The semiconductor apparatus according to any one of [B01] to [B03], in which
- the first interlayer insulating layer covers the first selection transistor and the second selection transistor, and
- the second interlayer insulating layer covers the first memory element and the first interlayer insulating layer.

[C01] The semiconductor apparatus according to any one of [A01] to [B04], in which
- the first memory cell includes one first memory element and one first selection transistor, and
- the second memory cell includes one second memory element and one second selection transistor. [C02] The semiconductor apparatus according to any one of [A01] to [B04], in which
- the first memory cell includes one first memory element and two first selection transistors, and
- the second memory cell includes one second memory element and two second selection transistors. [C03] The semiconductor apparatus according to any one of [A01] to [B04], in which
- the first memory cell includes two first memory elements and two first selection transistors, and
- the second memory cell includes two second memory elements and two second selection transistors.

[C04] The semiconductor apparatus according to any one of [A01] to [C03], in which a memory cell and a memory cell adjacent along the first direction are isolated by a transistor having the same structure as the selection transistor.

[C05] The semiconductor apparatus according to any one of [A01] to [C04], in which the first memory element and the second memory cell include perpendicular magnetization-type spin transfer torque based magnetic random access memory.

[C06] The semiconductor apparatus according to any one of [A01] to [C05], further including:
- a peripheral circuit, in which
- a dummy stack structure having the same configuration as a stack structure constituting the first memory element or the second memory element is formed above the peripheral circuit.

[D01]<<Semiconductor apparatus . . . Third aspect>>

A semiconductor apparatus including:
- a nonvolatile memory cell array including a plurality of memory cells, each of the plurality of memory cells including
- a resistance-variable nonvolatile memory element, and
- a selection transistor electrically connected to the nonvolatile memory element, and
- a peripheral circuit, in which
- a dummy stack structure having the same configuration as a stack structure constituting the nonvolatile memory element is formed above the peripheral circuit.

[E01]<<Method for manufacturing a semiconductor apparatus>>

A method for manufacturing a semiconductor apparatus including a nonvolatile memory cell array including:
- a plurality of first memory cells, each of the plurality of first memory cells including a first memory element including a resistance-variable nonvolatile memory element and a first selection transistor electrically connected to the first memory element, and
- a plurality of second memory cells, each of the plurality of second memory cells including a second memory element including a resistance-variable nonvolatile memory element and a second selection transistor electrically connected to the second memory element, in which
- a plurality of first memory elements and a plurality of second memory elements are arranged in a two-dimensional matrix in a first direction and a second direction different from the first direction and on the same interlayer insulating layer,
- the first memory element is larger than the second memory element,
- the first memory element and the second memory element are disposed adjacent to each other along the second direction,
- the method including at least each step of:
- forming the first selection transistor and the second selection transistor constituting the first memory cell and the second memory cell on a base portion, and then forming an interlayer insulating layer on an entire surface, and then forming, on the interlayer insulating layer, a stack film for forming the nonvolatile memory element electrically connected to the first selection transistor and the second selection transistor constituting the first memory cell and the second memory cell, and then patterning the stack film to form the first memory element and the second memory element.

[F01]<<Electronic device>>

An electronic device including the semiconductor apparatus according to any one of [A01] to [D01].

[F02]<<Electronic device>>

An electronic device including a nonvolatile memory cell array constituting the semiconductor apparatus according to any one of [A01] to [D01].

REFERENCE SIGNS LIST 11, 21 First memory element
12, 22 Second memory element
30 Stack structure
30A First surface of stack structure
30B Second surface of stack structure
31 Magnetization fixed layer
31A Fixed layer
31B Non-magnetic layer
31C Reference layer
31D Non-magnetic material layer
32 Intermediate layer
33 Storage layer (magnetization reversal layer or free layer)
34 Underlying layer
35 Cap layer
41 First wiring
42 Second wiring
51 Insulating material layer
60 Base portion (semiconductor substrate)
61 Gate electrode
62 Gate insulating layer
63 Channel formation region
64A, 64B Source/drain region
65 Connection hole
66, 66', 66" Contact hole
67 Interlayer insulating layer, first interlayer insulating layer
68 Second interlayer insulating layer
$TR_1$, $TR_2$, $TR_{1A}$ $TR_{1B}$, $TR_{1a}$, $TR_{1b}$, $TR_{2A}$, $TR_{23}$, $TR_2a$, $TR_2b$, $TR_{21}$,
$TR_{22}$ Selection transistor
TR' Isolation transistor
WL Word line
BL Bit line
SL Sense line

The invention claimed is:

1. A semiconductor apparatus comprising a nonvolatile memory cell array including:
a plurality of first memory cells, each of the plurality of first memory cells including a first memory element including a resistance-variable nonvolatile memory element and a first selection transistor electrically connected to the first memory element, and
a plurality of second memory cells, each of the plurality of second memory cells including a second memory element including a resistance-variable nonvolatile memory element and a second selection transistor electrically connected to the second memory element, wherein
a plurality of first memory elements and a plurality of second memory elements are arranged in a two-dimensional matrix in a first direction and a second direction different from the first direction and on a same interlayer insulating layer,
the first memory element is larger than the second memory element, and
the first memory element and the second memory element are disposed adjacent to each other along the second direction.

2. The semiconductor apparatus according to claim 1, wherein
a first memory element group including the plurality of first memory elements is arranged along the first direction,
a second memory element group including the plurality of second memory elements is arranged along the first direction, and
the first memory element group and the second memory element group are alternately arranged along the second direction.

3. The semiconductor apparatus according to claim 2, wherein
when an area of the first memory element is $S_1$ and an area of the second memory element is $S_2$, $1 < S_1/S_2 \leq 10$ is satisfied.

4. The semiconductor apparatus according to claim 3, wherein
when a formation pitch of the first memory element and the second memory element along the second direction is $P_{2\text{-}12}$, $1.1 \leq P_{2\text{-}12}/R_1 \leq 10$ is satisfied, but $S_1 = \pi(R_1/2)^2$.

5. The semiconductor apparatus according to claim 4, wherein
when a formation pitch of the first memory element and the first memory element along the first direction is $P_{1\text{-}12}$, $2 \leq P_{1\text{-}12}'/R_1 \leq 20$ is satisfied.

6. The semiconductor apparatus according to claim 1, wherein the first memory element and the second memory element are alternately arranged along the first direction.

7. The semiconductor apparatus according to claim 6, wherein
when an area of the first memory element is $S_1$ and an area of the second memory element is $S_2$, $1 < S_1/S_2 \leq 10$ is satisfied.

8. The semiconductor apparatus according to claim 7, wherein
when a formation pitch of the first memory element and the second memory element along the first direction is $P_{1\text{-}12}'$, and a formation pitch of the first memory element and the second memory element along the second direction is $P_{2\text{-}12}'$, $2 \leq P_{1\text{-}12}'/R_1 \leq 20$ $1 \leq P_{2\text{-}12}'/R_1 \leq 10$ are satisfied, but $S_1 = \pi(R_1/2)^2$.

9. The semiconductor apparatus according to claim 1, wherein the first memory element and the second memory element have different thermal stability.

10. A semiconductor apparatus comprising a nonvolatile memory cell array including:
a plurality of first memory cells, each of the plurality of first memory cells including a first memory element including a resistance-variable nonvolatile memory element and a first selection transistor electrically connected to the first memory element, and
a plurality of second memory cells, each of the plurality of second memory cells including a second memory element including a resistance-variable nonvolatile memory element and a second selection transistor electrically connected to the second memory element, wherein
a plurality of first memory elements and a plurality of second memory elements are arranged in a two-dimensional matrix in a first direction and a second direction different from the first direction,
the first memory element is formed on a first interlayer insulating layer,
the second memory element is formed on a second interlayer insulating layer located above the first interlayer insulating layer, and
the first memory element and the second memory element are disposed such that an orthographic projection image of the second memory element on the first interlayer insulating layer and the first memory element are located adjacent to each other along the second direction.

11. The semiconductor apparatus according to claim 10, wherein an orthographic projection image of the second memory element on the first interlayer insulating layer does not overlap the first memory element.

12. The semiconductor apparatus according to claim 10, wherein a size of an orthographic projection image of the second memory element on the first interlayer insulating layer is different from a size of the first memory element.

13. The semiconductor apparatus according to claim 10, wherein
the first interlayer insulating layer covers the first selection transistor and the second selection transistor, and
the second interlayer insulating layer covers the first memory element and the first interlayer insulating layer.

14. The semiconductor apparatus according to claim 10, wherein
the first memory cell includes one first memory element and one first selection transistor, and
the second memory cell includes one second memory element and one second selection transistor.

15. The semiconductor apparatus according to claim 10, wherein
the first memory cell includes one first memory element and two first selection transistors, and
the second memory cell includes one second memory element and two second selection transistors.

16. The semiconductor apparatus according to claim 10, wherein
the first memory cell includes two first memory elements and two first selection transistors, and
the second memory cell includes two second memory elements and two second selection transistors.

17. The semiconductor apparatus according to claim 10, wherein a memory cell and a memory cell adjacent along the first direction are isolated by a transistor having a same structure as the selection transistor.

18. The semiconductor apparatus according to claim 10, wherein the first memory element and the second memory cell include perpendicular magnetization-type spin transfer torque based magnetic random access memory.

19. The semiconductor apparatus according to claim 10, further comprising:
a peripheral circuit, wherein
a dummy stack structure having a same configuration as a stack structure constituting the first memory element or the second memory element is formed above the peripheral circuit.

20. A method for manufacturing a semiconductor apparatus including a nonvolatile memory cell array including:
a plurality of first memory cells, each of the plurality of first memory cells including a first memory element including a resistance-variable nonvolatile memory element and a first selection transistor electrically connected to the first memory element, and
a plurality of second memory cells, each of the plurality of second memory cells including a second memory element including a resistance-variable nonvolatile memory element and a second selection transistor electrically connected to the second memory element, wherein
a plurality of first memory elements and a plurality of second memory elements are arranged in a two-dimensional matrix in a first direction and a second direction different from the first direction and on a same interlayer insulating layer,
the first memory element is larger than the second memory element,
the first memory element and the second memory element are disposed adjacent to each other along the second direction,
the method comprising at least each step of:
forming the first selection transistor and the second selection transistor constituting the first memory cell and the second memory cell on a base portion, and then forming an interlayer insulating layer on an entire surface, and then
forming, on the interlayer insulating layer, a stack film for forming the nonvolatile memory element electrically connected to the first selection transistor and the second selection transistor constituting the first memory cell and the second memory cell, and then patterning the stack film to form the first memory element and the second memory element.

* * * * *